(12) United States Patent
Kamphuis et al.

(10) Patent No.: US 9,466,585 B1
(45) Date of Patent: Oct. 11, 2016

(54) REDUCING DEFECTS IN WAFER LEVEL CHIP SCALE PACKAGE (WLCSP) DEVICES

(71) Applicant: NXP B.V., Eindhoven (NL)

(72) Inventors: Tonny Kamphuis, Nijmegen (NL); Leonardus Antonius Elisabeth van Gemert, Nijmegen (NL); Roelf Anco Jacob Groenhuis, Nijmegen (NL); Caroline Catharina Maria Beelen-Hendrikx, Nijmegen (NL); Franciscus Henrikus Martinus Swartjes, Eindhoven (NL); Jetse de Witte, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/927,311

(22) Filed: Oct. 29, 2015

Related U.S. Application Data

(60) Provisional application No. 62/136,496, filed on Mar. 21, 2015.

(51) Int. Cl.
| | |
|---|---|
| *H01L 23/31* | (2006.01) |
| *H01L 23/00* | (2006.01) |
| *H01L 21/56* | (2006.01) |
| *H01L 21/304* | (2006.01) |
| *H01L 21/78* | (2006.01) |
| *H01L 21/683* | (2006.01) |
| *H01L 21/3065* | (2006.01) |

(52) U.S. Cl.
CPC .............. *H01L 24/94* (2013.01); *H01L 21/304* (2013.01); *H01L 21/3065* (2013.01); *H01L 21/561* (2013.01); *H01L 21/565* (2013.01); *H01L 21/6836* (2013.01); *H01L 21/78* (2013.01); *H01L 23/3114* (2013.01); *H01L 23/3164* (2013.01); *H01L 23/3178* (2013.01); *H01L 24/11* (2013.01); *H01L 2221/68327* (2013.01); *H01L 2224/11849* (2013.01); *H01L 2224/13022* (2013.01); *H01L 2224/13139* (2013.01); *H01L 2224/13144* (2013.01); *H01L 2224/13147* (2013.01)

(58) Field of Classification Search
CPC ... H01L 21/70; H01L 21/702; H01L 21/782; H01L 23/18
See application file for complete search history.

(56) References Cited

U.S. PATENT DOCUMENTS

| | | | |
|---|---|---|---|
| 8,766,312 B2 | 7/2014 | Sekine et al. | |
| 8,860,075 B2 | 10/2014 | Izuka et al. | |
| 2003/0017663 A1* | 1/2003 | Takyu | H01L 21/563 438/200 |

(Continued)

OTHER PUBLICATIONS

Non-Final Rejection Office Action—U.S. Appl. No. 14/927,283, May 23, 2016, 9 pages.

*Primary Examiner* — Cheung Lee

(57) ABSTRACT

Consistent with example embodiments, a wafer substrate undergoes processing in which a resilient material is applied to the front-side and back-side surfaces of the wafer substrate. By defining trenches in saw lanes between active device die, additional resilient material may be placed therein. In an example embodiment, after the active device die are separated into individual product devices, the resulting product device has coverage on the front-side surface, back-side surface, and the four vertical faces of the encapsulated active device die. The front-side surface has exposed contact areas so that the product device may be attached to an end user's system circuit board. Further, the resilient coating protects the encapsulated active device die from damage during assembly.

12 Claims, 26 Drawing Sheets

(56) References Cited

U.S. PATENT DOCUMENTS

| | | |
|---|---|---|
| 2011/0073889 A1 | 3/2011 | Sugizaki et al. |
| 2012/0056328 A1 | 3/2012 | Lai et al. |
| 2012/0104580 A1 | 5/2012 | Feng et al. |
| 2013/0034956 A1 | 2/2013 | Lai et al. |
| 2013/0175694 A1 | 7/2013 | Shih et al. |
| 2013/0277785 A1 | 10/2013 | Chen et al. |
| 2014/0326295 A1 | 11/2014 | Moslehi et al. |
| 2015/0171240 A1 | 6/2015 | Kapur et al. |
| 2015/0179544 A1 | 6/2015 | Chockanathan et al. |
| 2015/0243572 A1 | 8/2015 | Albers et al. |
| 2015/0262819 A1 | 9/2015 | Motai |
| 2016/0013154 A1 | 1/2016 | Ma et al. |

* cited by examiner

REDUCING DEFECTS IN WAFER LEVEL CHIP SCALE PACKAGE (WLCSP) DEVICES

FIELD

The embodiments of the present invention relate to semiconductor device packaging and, more particularly, to WLCSP packaging having modifications that protect the semiconductor die against defects during manufacturing.

BACKGROUND

The electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

The packaging of an IC device is increasingly playing a role in its ultimate performance. For example, in mobile devices (i.e., mobile phones, tablet computers, laptop computers, remote controls, etc), WLCSP components are used in their assembly. WLCSP components save valuable space in the mobile application.

During manufacturing, WLCSP devices may be subjected to a number of processes and stress which may affect product yield and product reliability. The yield has a direct bearing on the cost of the finished mobile product. The reliability affects the longevity of the finished mobile product.

There is a need for a WLCSP assembly process which can address the challenges raised by the needs of mobile applications.

SUMMARY

The present disclosure has been found useful in the packaging of semi-conductor devices which find their way into portable electronic devices, and in particular, WLCSP products which are furnished as unpackaged die to manufacturers of mobile devices.

According a first aspect of the present disclosure, there is a method for assembling a wafer level chip scale processed (WLCSP) wafer, the wafer substrate having a front-side surface and an opposite back-side surface, a plurality of device die on the front-side surface, the plurality of device die having bond pads upon which ball-drop solder balls are defined. The method comprises defining trenches in saw lanes, on the front-side surface, between each one of the plurality of device die, the trenches having a depth of a final device die thickness; filling the trenches and covering the front-side surface with a molding compound, the molding compound surrounding the solder balls on each one of the plurality of device die; back grinding the back-side surface of the wafer substrate to the depth of the final device die thickness; and sawing apart the wafer in the trenches filled with molding compound, so as to separate the plurality of device die into individual devices.

According to an example embodiment, filling the trenches includes covering the solder balls with molding compound.

According to an example embodiment, the method further comprises grinding down the molding compound covering the solder balls until surfaces of the solder balls are exposed.

According to an example embodiment, the back grinding further includes, relieving back-side surface stress with at least one of the following: chemical-mechanical polishing (CMP), dry polishing, plasma polishing.

According to an example embodiment, the method further comprises applying a coating on the back-side surface of the wafer substrate prior to sawing apart the wafer substrate.

According to an example embodiment, defining trenches in the saw lanes includes at least one of the following: plasma etching, laser grooving, or dicing-before-grinding (DbG).

According to an example embodiment, the method further comprises subjecting the wafer substrate to a reflow process, so as to break and remove any residual molding compound on the solder balls.

According to an example embodiment, the reflow process follows the filling of the trenches.

According to an example embodiment, sawing apart the wafer substrate is performed from the front-side surface or the backside surface.

According a second aspect of the present disclosure, there is method for assembling a wafer level chip scale processed (WLCSP) wafer, the wafer substrate having a front-side surface and an opposite back-side surface, the front-side surface having a layer of low-k material at a thickness, a plurality of device die on the front-side surface, the plurality of device die having bond pads upon which ball-drop solder balls are defined, the plurality of device die separated from one another by saw lanes. The method comprises laser grooving trenches in the saw lanes, the laser grooving done to a depth of the thickness of the low-k material; filling the trenches and covering the front-side surface with a front-side molding compound, the molding compound surrounding the solder balls on each one of the plurality of device die, the front-side molding compound has a first thickness; performing a flux-clean and reflow to break and remove flash over the solder balls; back-grinding the back-side surface of the wafer substrate to about a depth of a finished device; making first cuts with a saw blade of a first kerf, sawing through the back-side surface of the wafer substrate in the saw lanes, almost substantially at the depth of the finished device; applying a back-side molding compound to the back-side surface of the wafer substrate, wherein the molding compound fills in the first cuts and covers the back-side surface of the wafer substrate, the back-side molding compound has a second thickness; and making second cuts with a saw blade of a second kerf, the second cuts are at a depth a combination of the thickness of the finished device, the first thickness of the front-side molding compound, and the second thickness of the back-side molding compound, thereby separating the plurality of device die into individual devices, the individual devices having molding compound on vertical faces and on front-side and back-side surfaces.

According to an example embodiment, the laser grooving has a width of about three-fourths of a width of a saw lane.

According to an example embodiment, the first thickness of the front-side molding compound is comparable to the second thickness of the back-side molding compound.

According to an example embodiment, the first kerf is greater than the second kerf.

According a third aspect of the present disclosure, there is method for assembling a wafer level chip scale processed (WLCSP) wafer, the wafer substrate having a front-side surface and an opposite back-side surface, the front-side surface having a layer of low-k material at a thickness, a plurality of device die on the front-side surface, the plurality of device die having bond pads upon which ball-drop solder balls are defined, the plurality of device die spaced apart one another by saw lane regions. The method comprises filling saw lane regions and covering the front-side surface with a front-side molding compound, the molding compound surrounding the solder balls on each one of the plurality of device die, the front-side molding compound has a first thickness; back-grinding the back-side surface of the wafer substrate to about a depth of a finished device; laser grooving (LG) trenches in the saw lanes, the laser grooving done from the back-side surface of the wafer substrate to a depth of the thickness of the low-k material; making first cuts with a saw blade of a first kerf, sawing through the back-side surface of the wafer substrate in the saw lanes, to the depth of the finished device; applying a back-side molding compound to the back-side surface of the wafer substrate, wherein the molding compound fills in the LG trenches and first cuts and covers the back-side surface of the wafer substrate, the back-side molding compound has a second thickness; and making second cuts with a saw blade of a second kerf, the second cuts are at a depth a combination of the thickness of the finished device, the first thickness of the front-side molding compound, and the second thickness of the back-side molding compound, thereby separating the plurality of device die into individual devices, the individual devices having molding compound on vertical faces and on front-side and back-side surfaces.

According a fourth aspect of the present disclosure, there is method for assembling a wafer level chip scale processed (WLCSP) wafer, the wafer having a front-side surface and an opposite back-side surface, a plurality of device die on the front-side surface, the plurality of device die having bond pads upon which bumps are defined, the plurality of device die spaced apart one another by saw lanes. The method comprises covering the front-side surface with a molding compound, the molding compound surrounding the bumps on each one of the plurality of device die; defining trenches in the saw lanes, on the front-side surface, between each one of the plurality of device die, the trenches having a depth of a final device die thickness; mounting the wafer onto a grinding tape; back grinding the back-side surface of the wafer to the depth of the final device die thickness; over-molding the back-side surface and filling in the trenches in the saw lanes with a molding compound; and sawing apart the wafer in the trenches filled with molding compound, so as to separate the plurality of device die into individual devices.

According to an example embodiment, defining the trenches in the saw lanes includes, at least one of the following: sawing the topside surface of the wafer with DbG process; laser grooving; plasma etching; and again sawing to below the final device die thickness.

According to an example embodiment, the method further comprises before back-grinding the back-side surface of the wafer, filling in the trenches with a temporary filler material; and after back-grinding the back-side surface of the wafer, removing the temporary filling material from the trenches.

According to an example embodiment, back grinding further includes a stress-reducing process including at least one of the following: chemical-mechanical polishing (CMP), dry polishing, plasma polishing.

According a fifth aspect of the present disclosure, there is method for assembling a wafer level chip scale processed (WLCSP) wafer, the wafer having a front-side surface and an opposite back-side surface, a plurality of device die on the front-side surface, the plurality of device die having bond pads upon which bumps are defined, the plurality of device die spaced apart one another by saw lanes of a width. The method comprises defining a plurality of trench pairs in saw lanes, with a first saw blade of a kerf, on the topside surface, between each one of the plurality of device die, the trench pair having a depth of about half a device die thickness; applying a foil assist molding (FAM) tape the covering exposed surfaces of the bumps on each one of the plurality of device die; over-molding the topside surface and filling in the trench pairs with a molding compound; removing the FAM tape from the wafer; back grinding the underside surface of the wafer to the depth of the final device die thickness; applying molding compound onto the underside surface; and sawing apart the wafer, with a saw blade of a second kerf, about centers of the trench pairs filled with molding compound and through the underside surface covered with molding compound, so as to separate the plurality of device die into individual devices.

According to an example embodiment, a width of the trench pair is about the width of a saw lane.

According to an example embodiment, the width each trench in the trench pair is about one-fourth of the width of the saw lane, wherein the portion between each trench is about one half of the width of the saw lane.

According to an example embodiment, the width of each trench in the trench pair is about equal to the kerf of the first saw blade, and the portion between each trench is about equal to the kerf of the second saw blade.

According to a sixth aspect of the present disclosure, there is method for assembling a wafer level chip scale processed (WLCSP) wafer, the wafer substrate having a front-side surface and an opposite back-side surface, a plurality of device die on the front-side surface, the plurality of device die having bond pads upon which conductive studs, are defined, wherein the conductive studs are solder plated. The method comprises defining trenches in saw lanes, on the front-side surface, between each one of the plurality of device die, the trenches having a depth of a final device die thickness; covering the front-side of the wafer substrate with a protective material so that topside surfaces of the conductive studs are protected; filling the trenches and covering the front-side surface with a temporary filler, the temporary filler surrounding the conductive studs on each one of the plurality of device die; back grinding the back-side surface of the wafer substrate to the depth of the final device die thickness; removing the temporary filler from the trenches; over-molding the trenches from the back-side surface; reflowing the solder plating on the conductive studs; sawing apart the wafer in the trenches filled with molding compound, so as to separate the plurality of device die into individual devices.

According to an example embodiment, the conductive studs are pillar structures selected from one of the following: copper, gold, silver.

According to another example embodiment, the conductive stud is solder plating.

The above summaries of the present disclosure are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

Figure 1A:
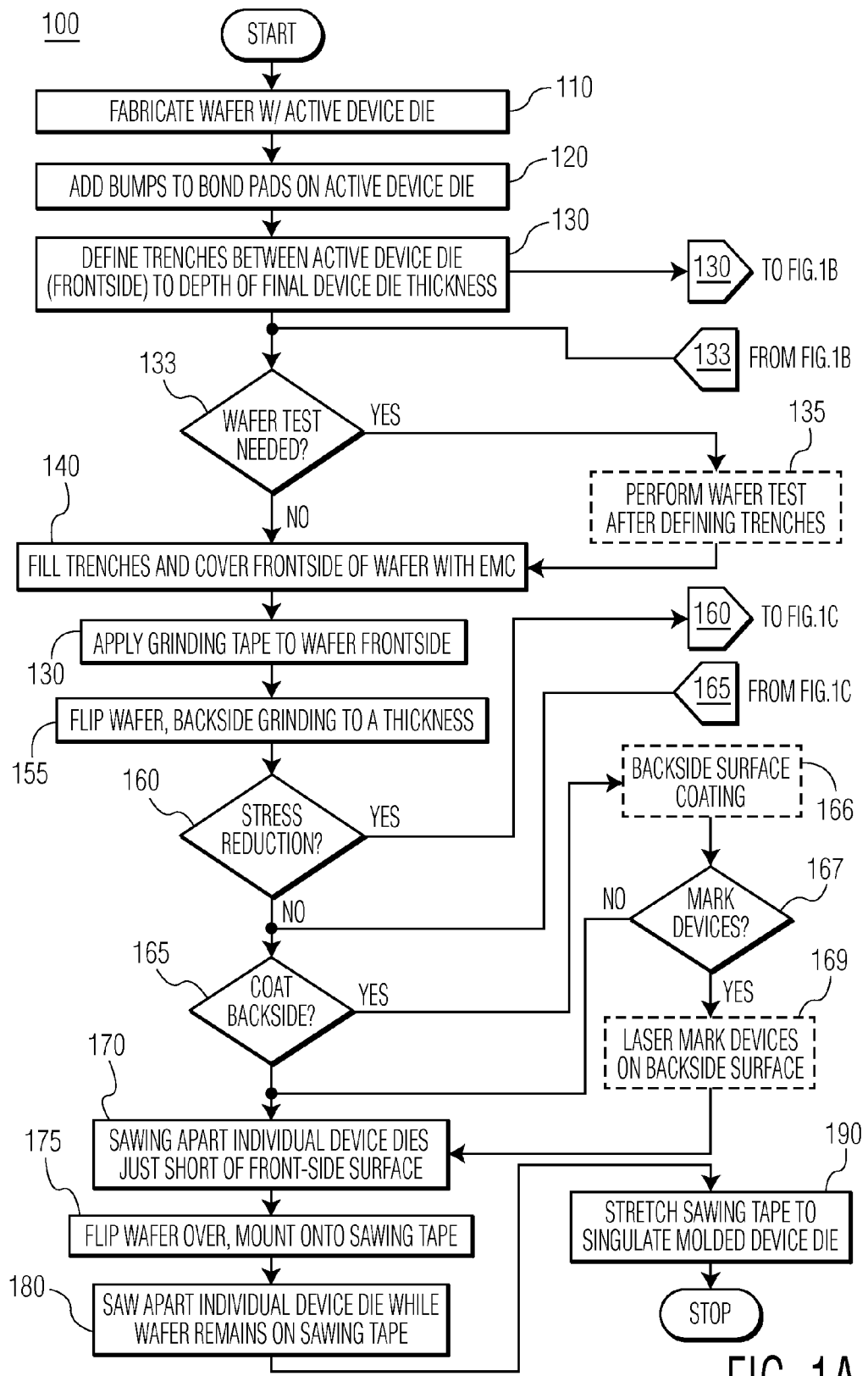
FIGS. 1A-1C are flow diagrams of an assembly process according to an embodiment of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The disclosed embodiments have been found useful in preventing damage to the Wafer Level Chip-Scale Product (WLCSP) devices during their assembly.

In processing wafers in accordance with the present disclosure, starting material may be a 300 mm wafer, but wafer substrates of smaller or larger sizes may be used. In addition, if the saw lane width reduced, for example, to 60 µm, the Wafer Substrate Parameters would likely scale downward.

TABLE 1

Wafer Substrate Parameters

| Wafer Attributes/Process Parameters | Dimensions |
| --- | --- |
| Active Device Depth (C90)/(C40) | 8-10 µm/3-5 µm |
| Example Saw Lane Width | 80 µm |
|  | (Varies between 30 µm-120 µm) |
| Process Control Monitor (PCM) Width | 60 µm |
| Optical Control Monitor (OCM) Width |  |
| Saw lane width would be used for drop-in PCM/OCM) | 30 µm |
| Bump Height Range | 40 µm-240 µm |
| Ball Drop (Example Height) | 180 µm |
| Plated Bump (Example Height) | 90 µm |
| Laser Grooving (LG) Width | 60 µm-62 µm |
| $Z_1$ Blade Kerf (Front-side Sawing) | 40 µm-55 µm |
| $Z_2$ Blade Kerf (Additional Sawing) | 25 µm-40 µm |
| $Z_b$ Blade Kerf (Back-side Sawing Range) | 50-120 µm |

Each of the device die on the wafer substrate has bond pads defined thereon so that the integrated circuit may be connected to the end user's system boards. For WLCSP products, the bond wires are replaced by direct contact to the system board via bumps. These bumps may be solder balls dropped and attached to the bond pads in one example process. In another example process, the solder balls may be defined through a solder plating process. In another process, the bumps may be copper (Cu), gold (Au), and silver (Ag) pillar (i.e. stud) bumps.

More information on a copper pillar bump process may be found in Zhang, Yun, et al. "A High Speed Cu Pillar Bump Plating Process," Microsystems, Packaging, Assembly & Circuits Technology Conference, 2008. IMPACT 2008 3$^{rd}$ International, pp. 28-31.

More information solder plating of solder bumps may be found in Karim, Zaheed, et al. "Lead-Free Solder Bump Technologies for Flip-Chip Packaging Applications," Advanced Interconnect Technology Ltd., Hong Kong. pp. 7.

More information on an aspect of solder ball drop process may be found in Chen, C. H. et al, "Development of Micro-Ball Placement Technology for WLCSP," IMPACT (International Microsystems, Packaging, Assembly and Circuits Technology Conference. (IEEE CFP11598-USB). pp. 4.

Before bumping, in an example process, an under bump layer (UBM) is defined. A passivation process starts with dielectric application and patterning on a wafer substrate having active device die. Patterning is done by photolithography. Under bump metallization (UBM) is applied by sputtering of metal or through a plating process, the particular areas defined through patterning by a photolithographic process or other suitable techniques. An example process of making UBM may be found in U.S. Pat. No. 8,093,097 of Thomas Lange et al, titled, "Layer Sequence and Method of Manufacturing a Layer Sequence," granted on Jan. 10, 2012 and assigned to NXP B.V., Eindhoven, Netherlands, and is incorporated by reference in its entirety. The UBM ensures proper adhesion to the bump pad on the die, act as a barrier layer and ensures solderability. After UBM, the wafer has bumps applied thereon.

The example UBM technique and solder bump processes presented may be used in the embodiments of the present disclosure. Note that other UBM techniques or variations of solder bump processes may be used, as well.

Dicing, Molding Before Grinding

Figure 1B:
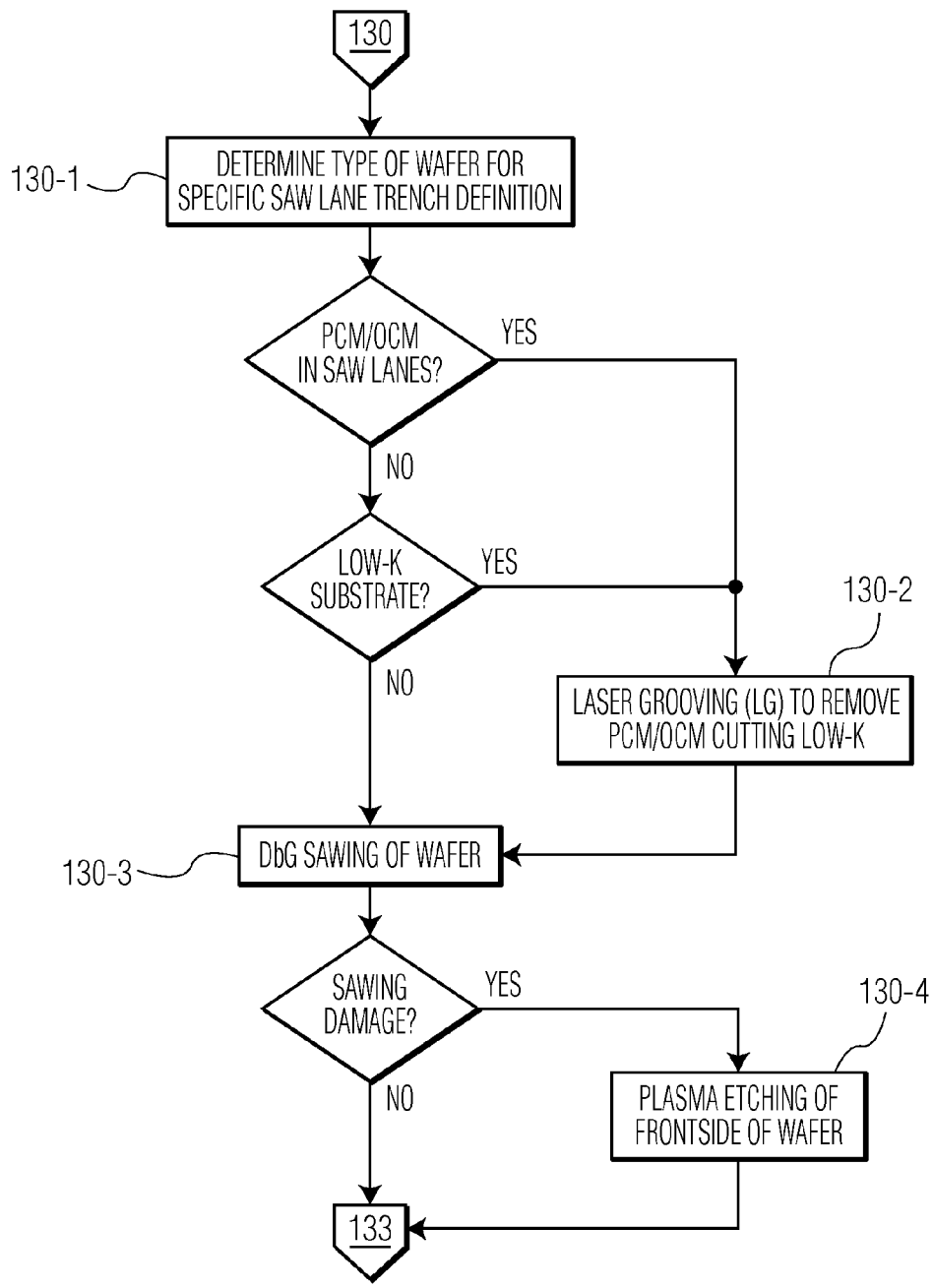
Figure 1C:
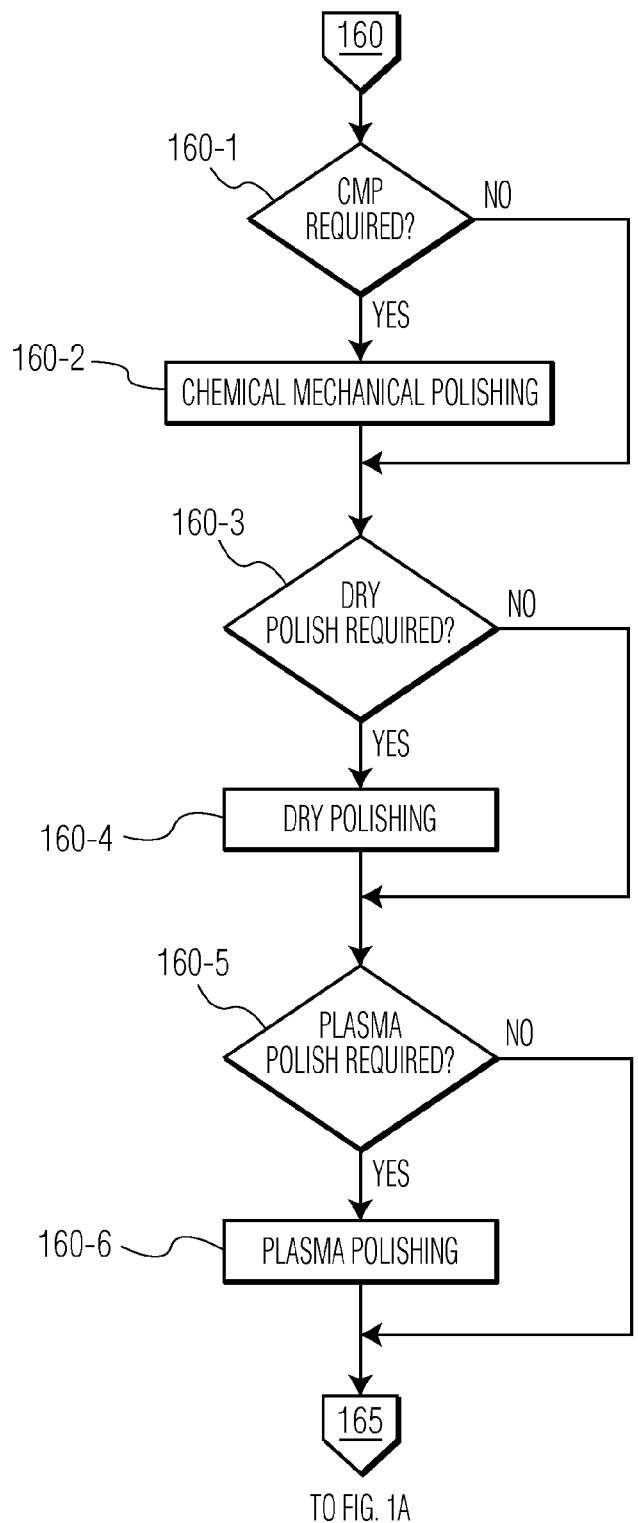

Refer to FIGS. 1A-1C. In an example embodiment, a wafer having active device die is fabricated in step 110. The wafer has a front-side surface and a back-side surface. A plurality of device die have been manufactured on the topside surface. These active device die have bond pads surrounding the device circuitry. Bumps or solder balls may be placed onto bond pads of the active device die in step 120. In step 130, trenches are defined between the active device die, the position trenches correspond to the saw lanes between the active device die.

Refer to FIG. 1B. Depending upon the wafer or device type, the trenches may be defined by sawing, etching, laser grooving, or a combination thereof (see steps 130-1 through 130-4). The sawing steps 130-1 to 130-4 may include a DbG (dicing-before-grinding) sawing process.

In other applications, a DbG may be employed in the process of singulating individual active devices from wafer substrates. Information on the DbG process may found in the paper titled, "Advanced Solutions for Ultra-Thin Wafers and Packaging" by Gerald Klug, DISCO HI-TEC EUROPE GmbH.

The depth of trenches is governed by the final thickness of the WLCSP die. In an example embodiment, in optional, steps 133 and 135, the active device die may undergo "wafer test," after the trenches are defined. Each of the device die are electrically tested via an arrangement of probes; the probes apply the appropriate electrical stimuli to the device to determine whether it functions to specification. Defective devices are identified by generating a wafer map of defective devices or by depositing ink dots thereon. These defective devices are then culled out when individual devices are packaged.

Having defined the trenches between active device die on the topside surface, in step 140, the trenches are then filled in and the front-side surface of the wafer is enveloped in a molding compound. Such molding compounds may include but are not necessarily limited to, epoxy molding compound (EMC), dispensed resins, or other liquid materials, etc. After filling in the trenches, a protection tape is applied to the molded front-side surface, in step 150, prior to grind the underside surface of the silicon substrate to a prescribed thickness. The front-side molding compound allows for a thinner post-ground silicon, as it adds rigidity to the constructed layers of encapsulation compound and silicon.

A back-side grinding (i.e., "back-grinding") is performed on the underside surface, in step 155. The back-side surface is ground down to a prescribed thickness. In an example process, the prescribed thickness is a thickness for a device die that has completed the process. For example, a pre-grinding thickness, of a "twelve-inch" wafer (300 mm) is about 775 μm, for an "eight-inch" wafer (200 mm) about 725 μm. Note that this technique in the present disclosure may be applied to wafer substrates of any size and may be useful for "twelve-inch" (300 mm) substrates. After back-grinding, the back-surface of the wafer may undergo a back-side stress-reduction process (at step 160) which may include (in steps 160-1 through 160-6) chemical mechanical polishing (CMP), dry polish, plasma polishing etc. The particular order of the polishing would be determined by specific manufacturing parameters. An example final thickness of the silicon part of the WLCSP construction may range between about 30 μm to a about 240 μm.

In step 170, while the wafer substrate remains on the grinding tape, the wafer substrate is sawed apart in the region of the filled trenches. This may be accomplished using a wider saw blade compared to Z1. Due to the depth of the saw lane, cutting is stopped just prior to reaching the front-side surface. In another example process, before the sawing of the substrate, in an optional step 165, an additional coating may be applied to the ground back-side surface of the wafer. Further, in optional steps 167-169, the under-side areas of device die may be laser marked. In step 175 the wafer substrate is flipped over and mounted onto a sawing tape; the back-grinding tape is removed. The laser marking may be applied to either an uncoated or coated underside. In step 180, the wafer substrate is flipped over and mounted onto a dicing/expansion foil; the protective back grind tape used in the back-grinding, trench filling, and underside coating, is removed. The wafer is flipped. Optionally in case the plated bumps were not yet reflowed, the reflow process and flux clean process can follow now, prior mounting the molded wafer to a sawing tape for device singulation. With a saw blade of an appropriate kerf, at step 180, the wafer substrate may sawed further to separate the substrate into individual devices. Stretching of the dicing/expansion foil singulates the molded device die from one another. Also other processes may be employed to singulate the packages can be used, such as but not limited to laser, water, etc.

Figure 2A:
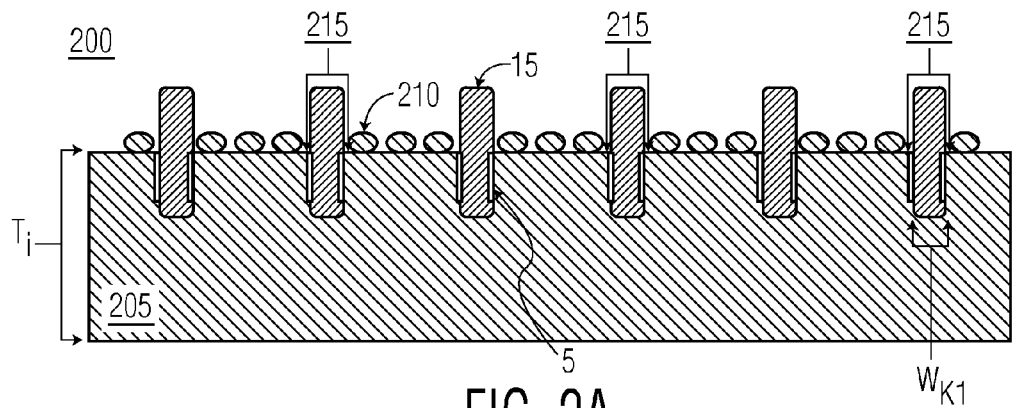
FIGS. 2A-2I is a series of side-views of the assembly process of FIGS. 1A-1C.
Figure 2B:
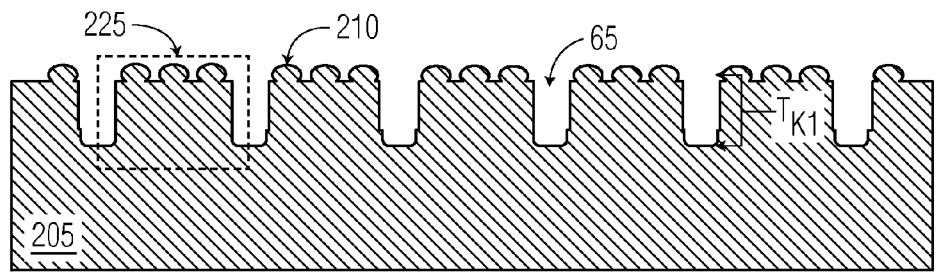

In the example embodiment in connection with FIG. 1, in a series of side-views, FIGS. 2A-2H depicts, on a wafer substrate, the process. Refer to FIG. 2A. On a wafer substrate 205 that has not yet undergone a back-grinding (having a thickness $T_i$), active device die 225 (as shown by the dashed-line box) have solder bumps 210 attached to bond pads (not illustrated). The active device die 225 are separated by saw lanes 215. In an example process, either a trench etch or a laser grooving (LG) makes a first cut 5 into the saw lanes. With a saw blade 15, of a first kerf suitable for the saw lane width between active device die 225, the saw blade 15 makes a cut 65 in the saw lanes 215 to a depth $T_{K1}$ of a least a final active device die 225 thickness. FIG. 2B shows the wafer substrate 205 after trench etch, laser grooving and sawing, the saw lane opening 65 surrounds each of the active device die 225. In that the wafer substrate has not undergone back-grinding, the active device die do not move relative to one another resulting in a clean cut.

Figure 2C:
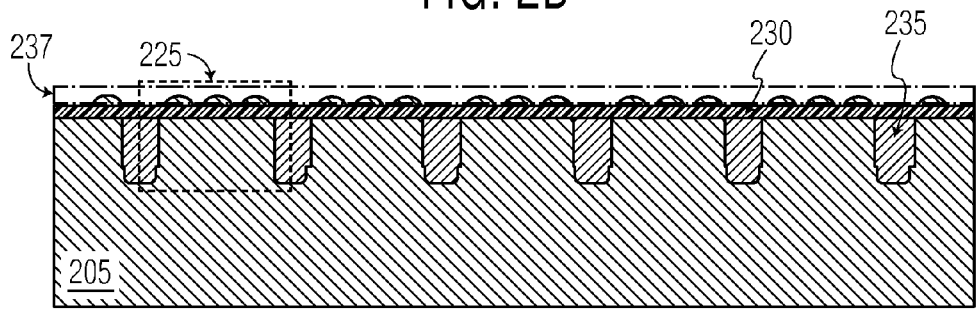
Figure 2D:
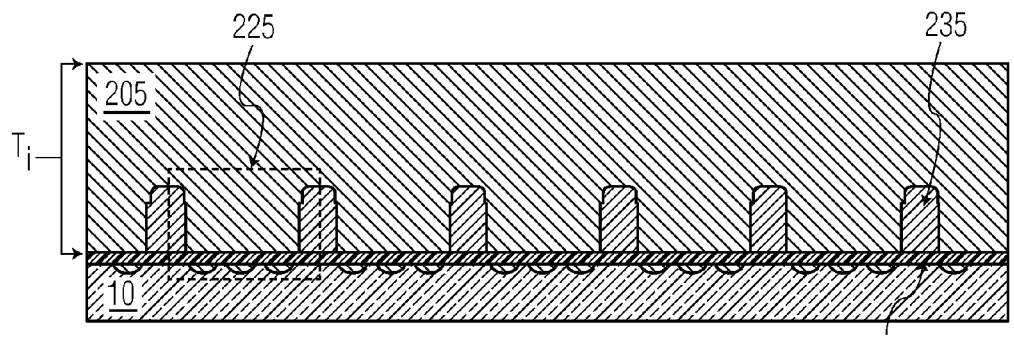
Figure 2E:
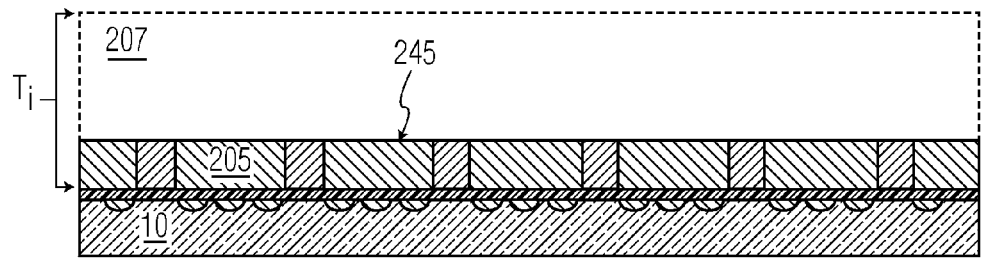

Refer to FIGS. 2C-2E. A molding compound 235 fills in the saw lane opening 65. Further, molding compound 230 surrounds the solder bumps 210 of each active device 225. In preparation for back grinding, on the top side surface of the wafer, a grinding tape 10 is attached. The wafer substrate 205 is undergoes back grinding such a thickness 207 is removed and exposes the underside surfaces the molding compound 235, in the saw lanes; the final device die 215 may have a final thickness ($T_f$) of the silicon of about 30μ to about 240 μm micron, depending upon the particular thinning process applied.

With a few additional processing steps, the molding compound 235 may be over-molded over the solder balls 210. The wafer substrate 205 may be placed on a grinding tape and the over-molded (region with wide-dashed lines 237) with the molding compound 230. With a grinding, polishing process, the over-molded region 237 may be removed so as to leave exposed surfaces of the solder balls 210.

Figure 2F:
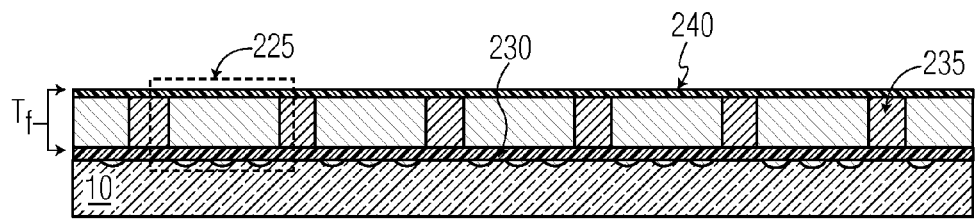

Refer to FIG. 2F. In an example process, an additional BCS coating 240 may be applied to the ground underside surface 245. In case the plated bumps were not yet reflowed, prior molding the front-side, the reflow and flux clean step may take place.

Figure 2G:
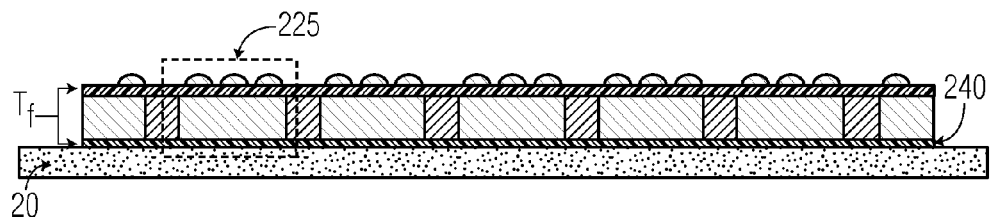
Figure 2H:
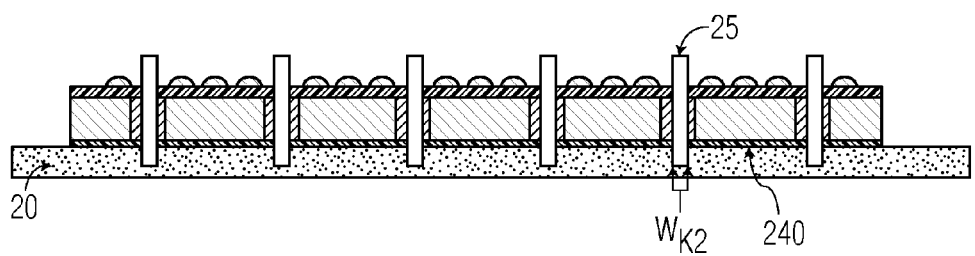

Refer to FIGS. 2G-2H. The wafer substrate 205 of a plurality of active devices 2225 each active device now separated by molding compound 235 is mounted on to a sawing/dicing tape 20. With a saw blade 25 of a second kerf (the second blade kerf smaller than the first kerf blade, discussed in previously) the active devices 225 are singulated into individual devices.

Figure 2I:
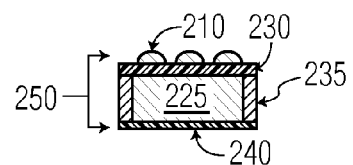

Refer to FIG. 2I. The finished individual device 250 has its solder bumps 210 surrounded by a resilient material 230; the vertical sidewalls of the silicon die 225 are protected with the same resilient material 235 (the same or similar material that surrounds the solder bumps 210); and the underside surface 245 of the silicon die 225 is protected by additional resilient material 240. The disclosed singulation process has minimized sidewall cracking and chipping and further, the edges of the silicon die 225 are protected from subsequent handling during assembly into a given sub-system printed circuit board (PCB) that may be part of a mobile device, for example.

In an example process, wafers having a low dielectric constant (k<3.0) may be assembled according to embodiments of the present disclosure. Use of materials with a k value lower than that of silicon dioxide ($SiO_2$) has reduced the interconnect structure capacitance. Further, with the replacement of aluminum (Al) interconnects with those of copper (Cu), the structural resistance is reduced. This emerging technology is becoming increasingly relevant in the myriad of systems and products on the market and in development. In particular, low-k materials may be susceptible to side wall cracking as wafer substrates are separated into individual device die.

In some wafer substrates, process control monitor (PCM) circuits are laid out in the saw lanes. These PCM circuits are used to keep track of critical parameters during selected steps in the fabrication of the active devices and are constructed in parallel with the active devices during the photolithography and etching processes. Continual monitoring of the PCM values throughout the process may serve as an indicator of the production line stability and provide data for statistical process control (SPC). Further, if on a particular wafer, PCM values go out of acceptable ranges during a process step, the operator may choose to scrap the wafer rather than processing it further and incurring additional costs that are unnecessary. Like the active devices on the wafer substrate, there is metallization present on the PCM circuits. The sawing and singulation process may be adversely affected by the PCM metallization and contribute to the sidewall cracking.

Laser grooving is oftentimes used as part of a singulation process, involving multiple techniques in slicing and dicing of the wafer substrate. The objective of the laser grooving is to minimize sidewall cracking and underside stress. Plasma dicing or other etching processes to pre-cut the low K/active layer, may be added prior to the first blade cut step.

More details of use of a laser in the dicing process may be found in U.S. patent application (Ser. No. 13/687,110) of Sascha Moeller and Martin Lapke titled "Wafer Separation," filed on Nov. 28, 2012, published on May 29, 2014 as US 2014/0145294 A1, and is incorporated by reference in its entirety.

Further information on "low-k grooving" may be found in the product brochure titled, "Laser Application" of DISCO Corporation, Tokyo, Japan.

Refer to FIGS. 3A-3F. In accordance with the present disclosure, a series of views depicts a pair of device contacts having solder balls defined thereon. In an example process, the device boundary may be defined by a seal ring (SR). The solder ball's edge is about 350 um from the SR; the ball has a horizontal dimension of about 260 µm, the under-ball-mount (UBM) has a length of about 240 µm on a side; the overall height is about 200 µm.

Figure 3A:
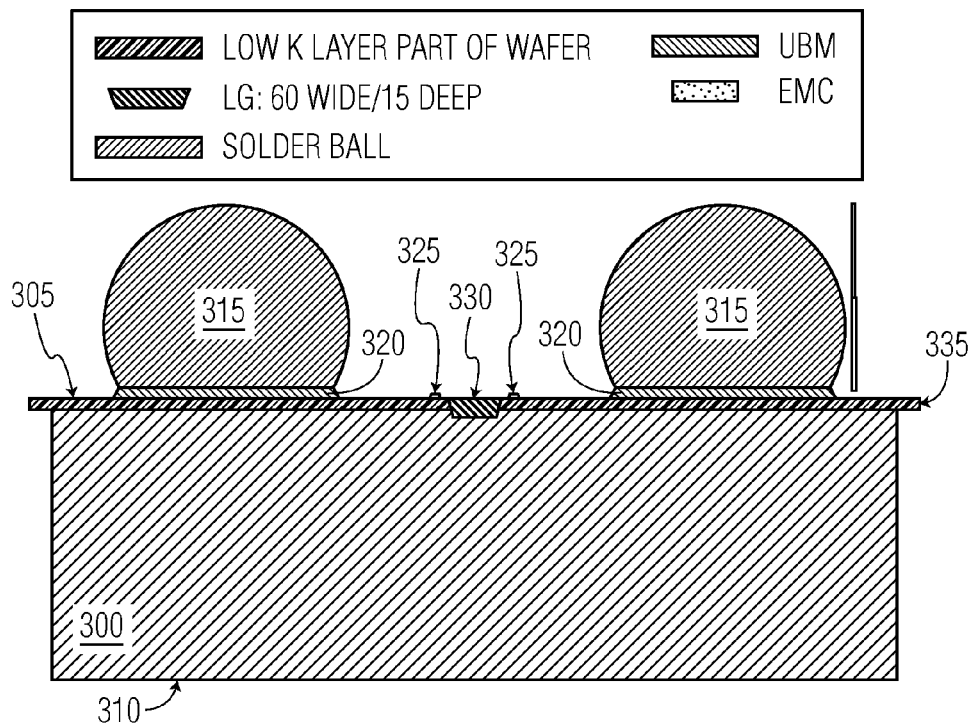
FIGS. 3A-3F is a series of side-views solder balls on the front-side surface of the wafer substrate as it assembled according to an embodiment the present disclosure.
Figure 3B:
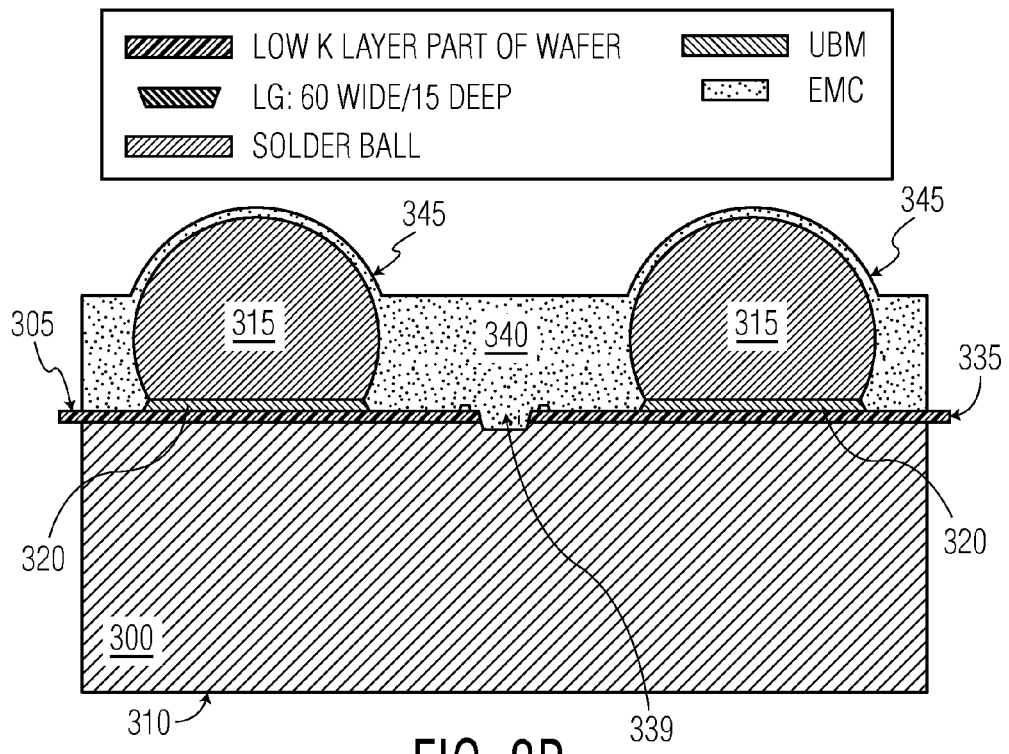
Figure 3C:
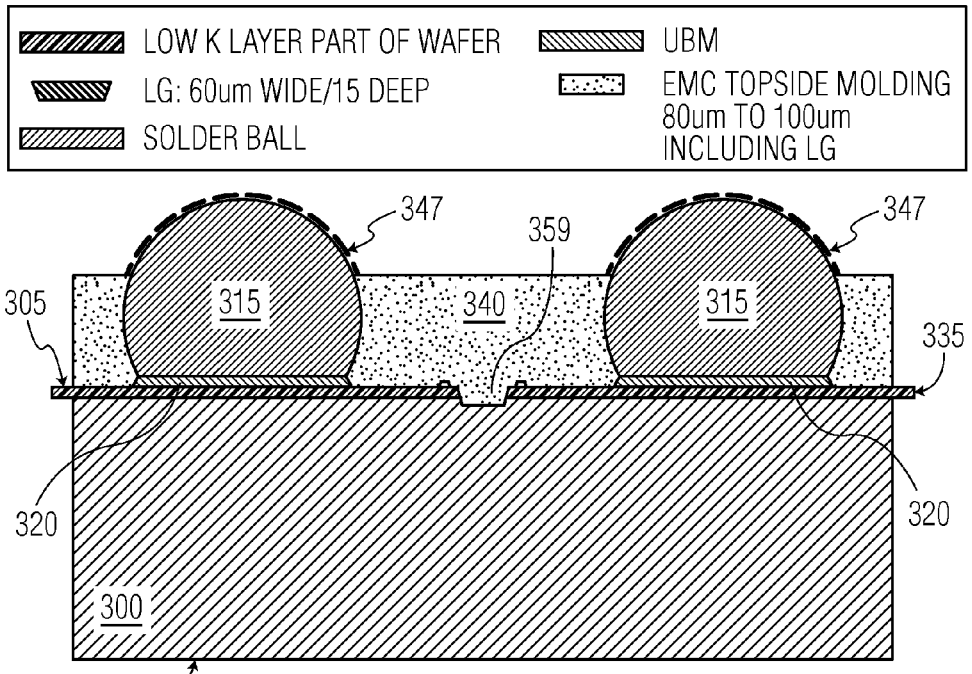
Figure 3D:
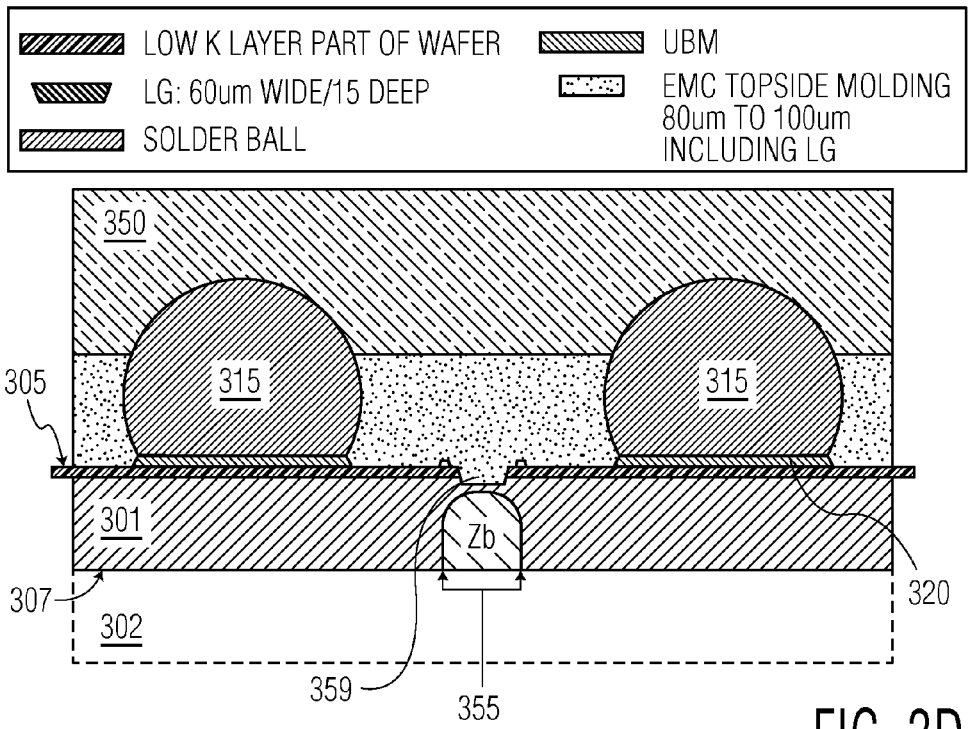

Refer to FIG. 3A. An example wafer substrate 300 has a topside surface 305 and an underside surface 310. The topside surface includes active devices and a low-k layer 335. Two devices are separated by a saw lane defined by SR locations 325. Laser grooving 330 has removed the low-k material from a center area of the saw lane between two devices, each having a contact structure consisting of a UBM 320 and a solder ball 315 defined thereon. The groove has a depth of about 15 µm and a width of about 60 µm. Refer to FIG. 3B. A molding compound, for example, epoxy molding compound (EMC) has been applied to the topside surface 305 of the wafer substrate 300. The compound 340 fills the spaces between solder balls and fills-in a trench 335 (defined by the laser groove 330). The compound 340 may form a thin film 345 over the solder balls 315. The overall thickness of the compound 340 may range from about 80 µm to about 100 µm. Refer to FIG. 3C. With a flux cleaning and reflow process, any EMC flash or residue 347 breaks off and washes away from the solder balls. Thus, a solder ball 315 having a solderable surface is surrounded by EMC 340. Refer to FIG. 3D. A flexible grinding tape 350 is applied to the topside surface of the solder balls 315. The underside surface 310 of the wafer substrate 300 undergoes a back grinding removing undesired material 302 until about 100 µm of wafer substrate 301 remains. In the vicinity of the LG trench 335, a saw blade $Z_b$ cuts substantially through the thinned wafer substrate 301 from the underside surface 307.

Figure 3E:
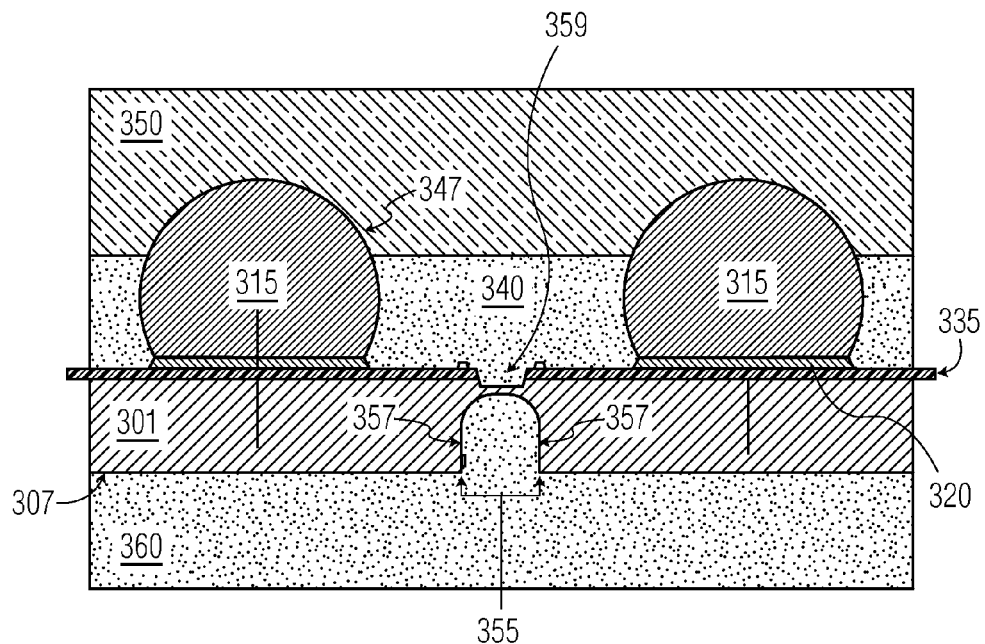

Refer to FIG. 3E. Having defined the $Z_b$ cut 355, an underside molding 360 fills in the cut 355 and covers the underside surface 307 of the thinned wafer substrate 301. The thickness of the underside molding 360 is comparable to that of the topside molding 340.

Figure 3F:
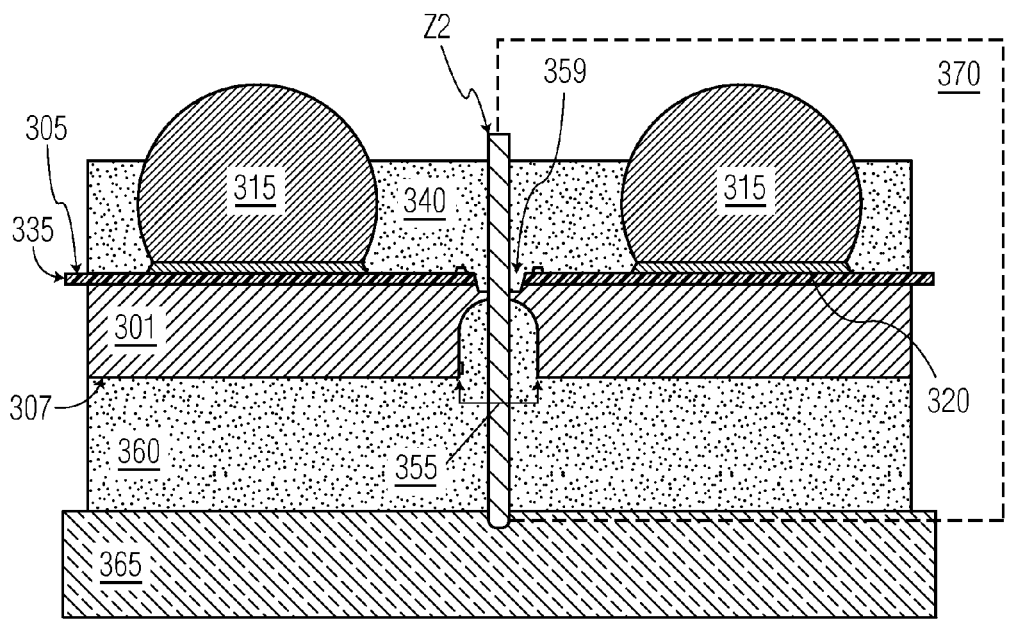

Refer to FIG. 3F. With another blade Z2, the wafer substrate 301 having encapsulated devices 370, is sawed into individual devices.

The afore-mentioned process described the flux removal of molding compound residue and flash 345 and the reflow of the solder balls 315. In another example embodiment, the solder balls or bumps may be fully enveloped (i.e. "overmolded") in a molding compound. In addition to a flux clean/reflow process, the enveloped surface of the solder balls may undergo a grinding process to remove the molding compound and expose surfaces of the solder balls. These exposed surfaces will be flat and flush with the surrounding molding compound that has been ground.

In an example embodiment, the molding compound may be initially applied to the front-side surface of the wafer substrate; the molding compound surrounds the solder bumps, followed by sawing and laser grooving (if a low-k substrate used) from the back-side. After the sawing and laser grooving, the molding compound is applied. The back-side surfaces and vertical side faces of the device die are enveloped in the molding compound. An additional sawing through the front-side surface in the saw lanes between device die, singulates the device die into individual WLCSP devices. Each WLCSP device die has all surfaces protected by the molding compound.

Figure 4A:
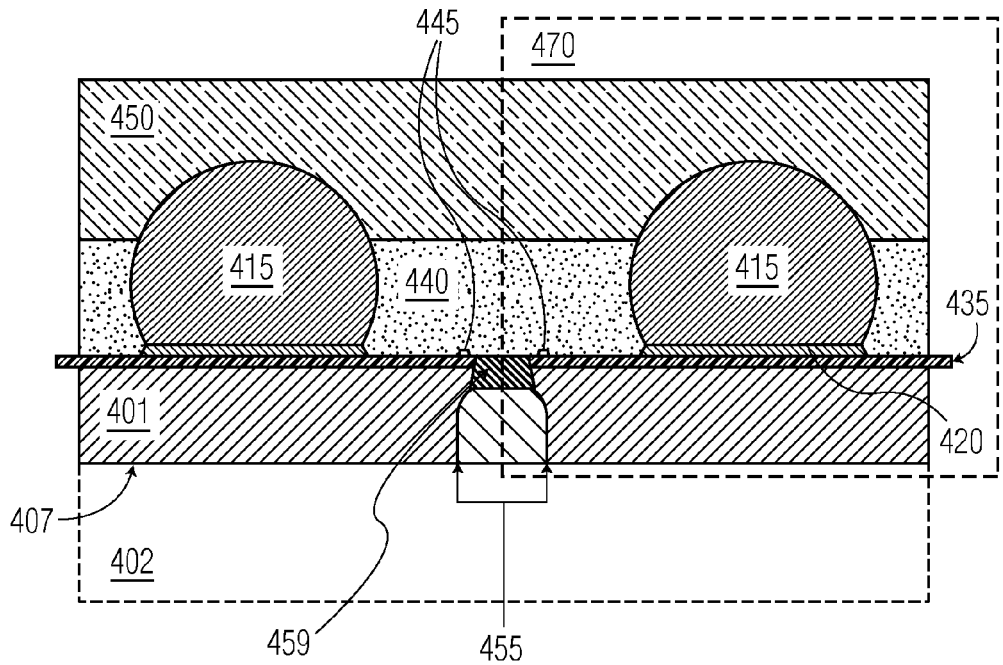
FIGS. 4A-4C is a series of side-views of the wafer substrate as it is assembled according to an embodiment of the present disclosure.
Figure 4B:
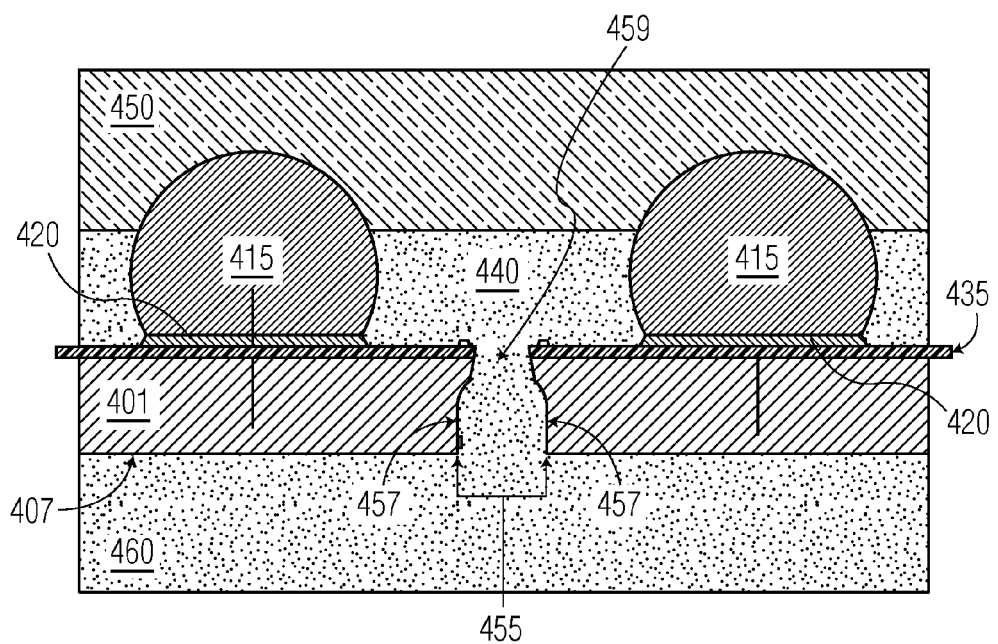
Figure 4C:
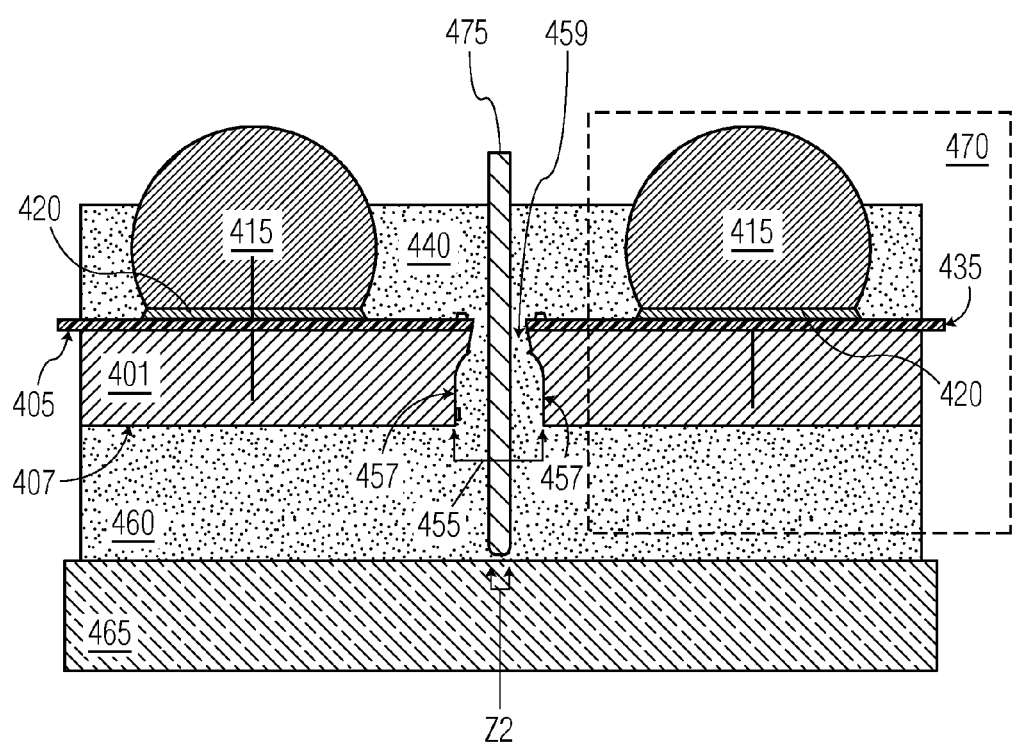

Refer to FIGS. 4A-4C. In FIG. 4A, a wafer substrate 401 shows two contact UBM structures 420 to which dropped balls 415 are attached on two active devices separated by a saw lane 445. On the front-side surface, the active device die 470 are enveloped in a molding compound 440, the molding compound is about 80 µm to about 100 µm thick. The wafer back-side surface 407 is ground to a final thickness of 100 µm, a predetermined amount of substrate material 402 had been removed. Flexible grinding tape 450 keeps the wafer substrate 401 stable during the back-grinding. With a first cut (for example about 75 µm to about 80 µm) with a blade Zb, the wafer material 401 is removed until the low-k region 435 begins (which is about the depth of the active device 470, or for example, about 10 µm to about 20 µm). A laser grooving (LG) cuts through the remaining substrate 435. Refer to FIG. 4B. A back-side molding 460 is applied to the back-side surface 407; the back-side molding 460 fills in the opening 455 made by the sawing and laser grooving. The sawing portion 457 and LG portion 459 are filled in with molding compound 460. The thickness of the back-side molding 460 is comparable to that of the front-side molding 440. Refer to FIG. 4C. With a second saw blade 475 with a kerf Z2, the molded WLCSP devices 470 are separated into individual devices, each having protection on all six-sides.

Molding Before Grinding and Sawing

Figure 5A:
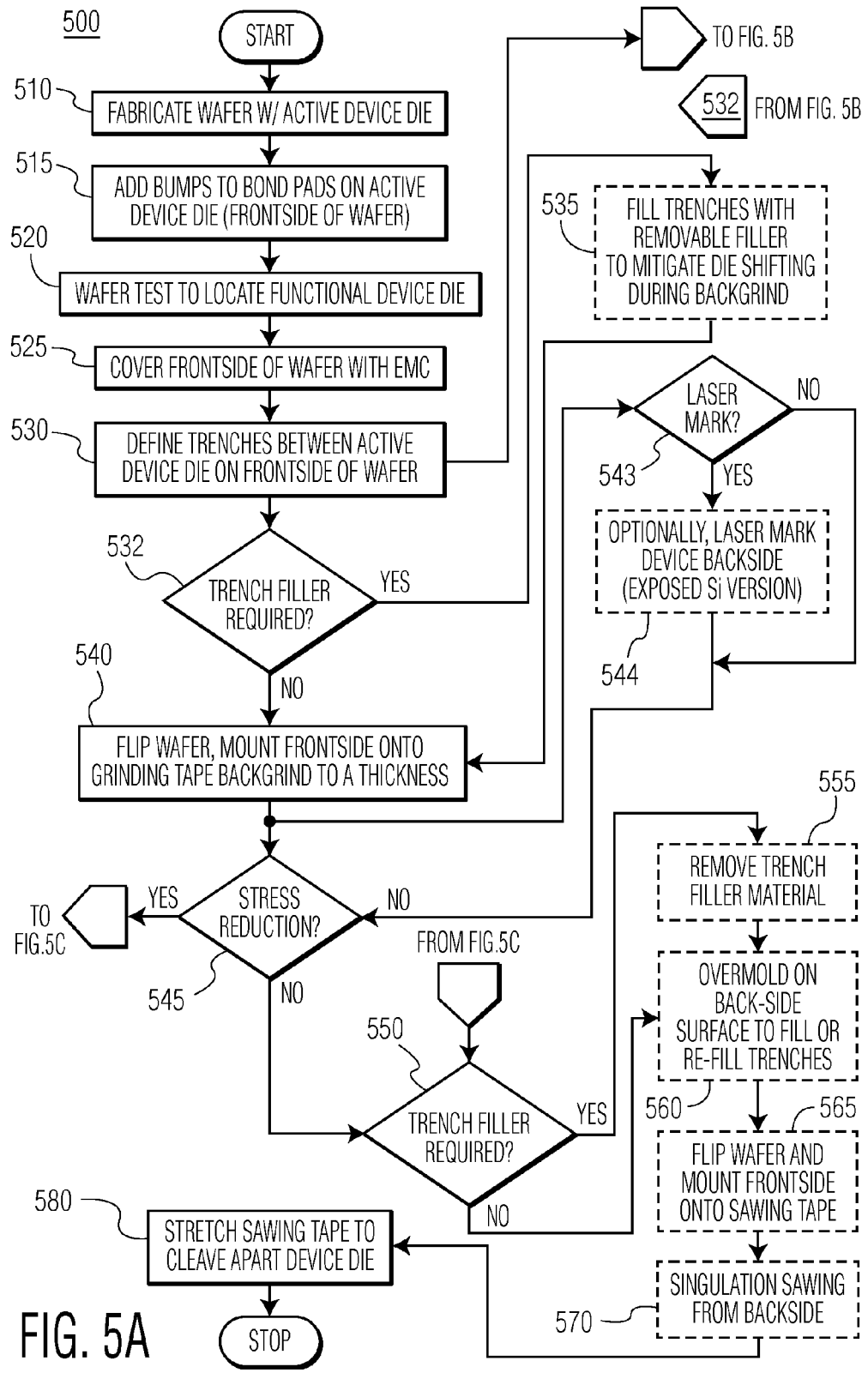
FIGS. 5A-5C are flow diagrams of an assembly process according to an embodiment of the present disclosure.
Figure 5B:
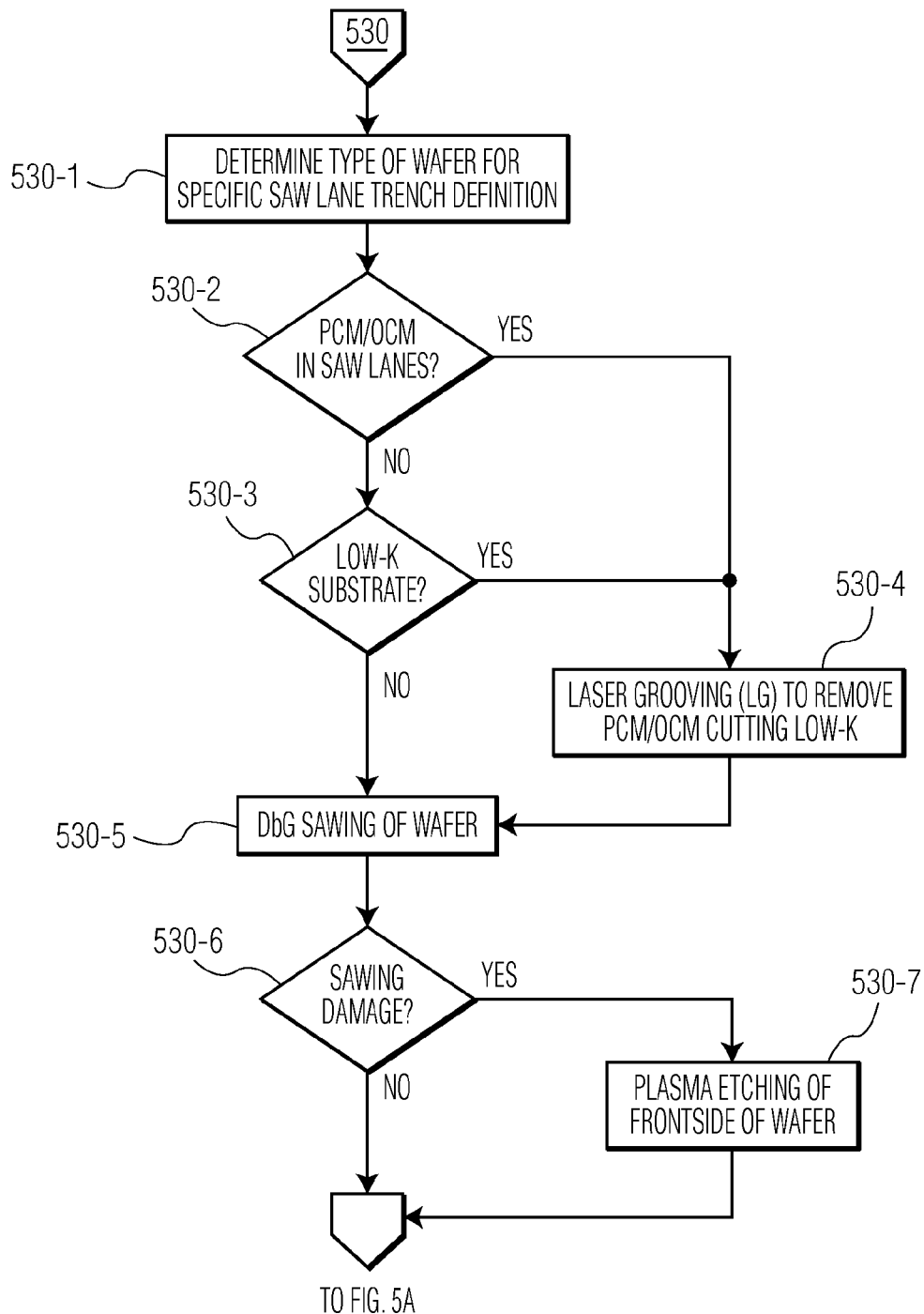
Figure 5C:
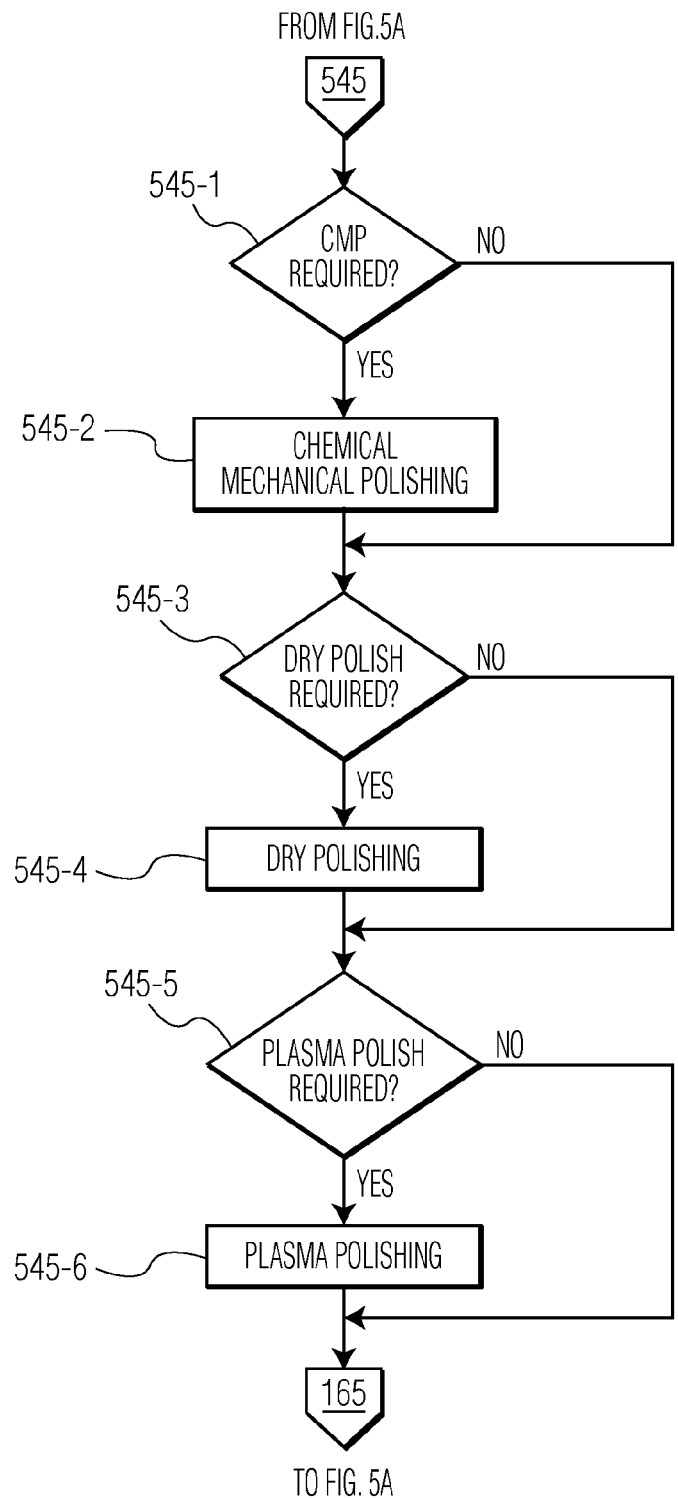

Refer to FIGS. 5A-5C. In an example embodiment, a wafer substrate with active device die is fabricated at step 510. In step 515, as needed, solder bumps are applied to the bond pads of the active devices on the wafer substrate. In step 520, the active devices may undergo testing with a wafer prober apparatus and automatic test equipment. The positions are mapped for the functional device die. Defective die may either be inked with a distinctive mark (e.g., an ink dot or line) or be mapped, as well.

Having made note of the functional active device die, in step 525, the topside surface of the wafer substrate is covered with an epoxy molding compound (EMC) or other suitable material.

Refer to FIG. 5B. With an example process, in a series of steps 530, with a DbG process, trenches are defined between the active device die on the topside surface of the wafer. If necessary, a multi-step approach may be used to minimize topside damage which may include laser grooving or a plasma etching followed by DbG to depth below the final device die thickness. In Step 530-1 the type of wafer in which trenches are defined, has to be determined. For example, the user has to determine whether PCM/OCM devices are present in the saw lanes, step 530-2, or whether in step 530-3 a low-k substrate has been used. Having removed possible PCM/OCM or low-k material in step 530-4, a DbG sawing of the wafer is done in step 530-5. If sawing damage is ascertained, in step 530-6, a plasma etching of the front-side of the wafer substrate is performed in step 530-7.

In another example embodiment, in an optional steps 532 and 535, the trenches may be filled with a removable filler material to reduce the likelihood of the device die shifting during back grinding.

In step 540 the wafer substrate is flipped over and mounted onto a grinding tape with its topside surface attached thereto. The wafer undergoes a back-grinding to a prescribed thickness. Refer to FIG. 5C. In an optional step 545, the back-ground underside surface of the wafer substrate may be subjected to a stress-reduction process with one or more processes including, but not necessarily limited to chemical-mechanical polishing (CMP) of step 545-1, dry polishing of step 545-2, or a plasma polishing of step 545-3.

In another optional step 555, the temporary filler material of step 535 is removed. An additional over-process refills the trenches in step 560 and covers the back-side surface of the wafer substrate. If no trench filler were used, see step 550, then the over-mold step 560 is applied directly. In either case, the devices are covered on six-sides with a resilient protective material.

Having performed this extra step, each of the active device die are covered on six sides with a resilient material.

Optional steps 543-544 of laser marking device indicia, corresponding to the position of each active device, on the underside surface of the wafer substrate may be performed. The laser marking may be performed after the additional over-molding step 560, or directly onto the exposed underside surface of the wafer substrate.

At step 565, the wafer having undergone a coating, is flipped over and its front-side surface is mounted onto a sawing tape. At step 570, a singulation sawing from the back-side surface in areas corresponding to the saw lanes is performed.

At step 580, the dicing/expansion foil is stretched to cleave apart the device die into protected WLCSP individual devices.

Having separated the active device die into individual devices, a final test or other processing may be performed before shipping product to the end user.

In the example embodiment in connection with FIGS. 5A-5C, in a series of side-views, FIGS. 6A-6K depicts, on a wafer substrate, the process described previously.

Figure 6A:
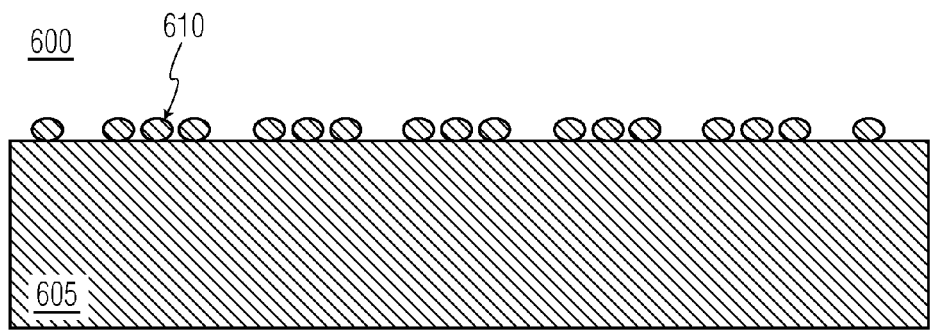
FIGS. 6A-6K is a series of side-views of the assembly process of FIGS. 5A-5C.
Figure 6B:
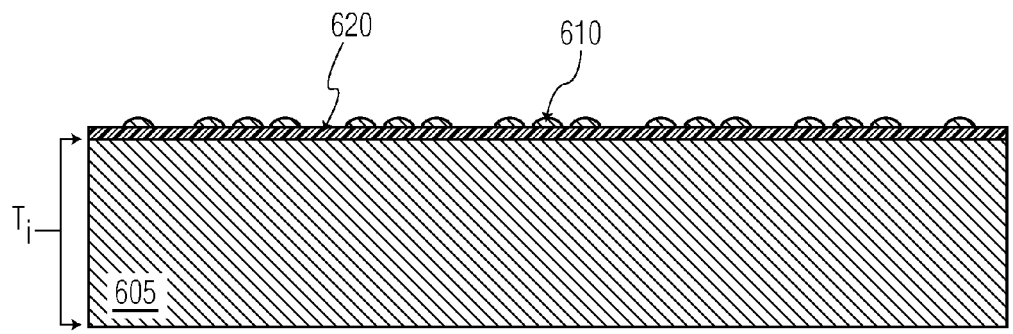
Figure 6C:
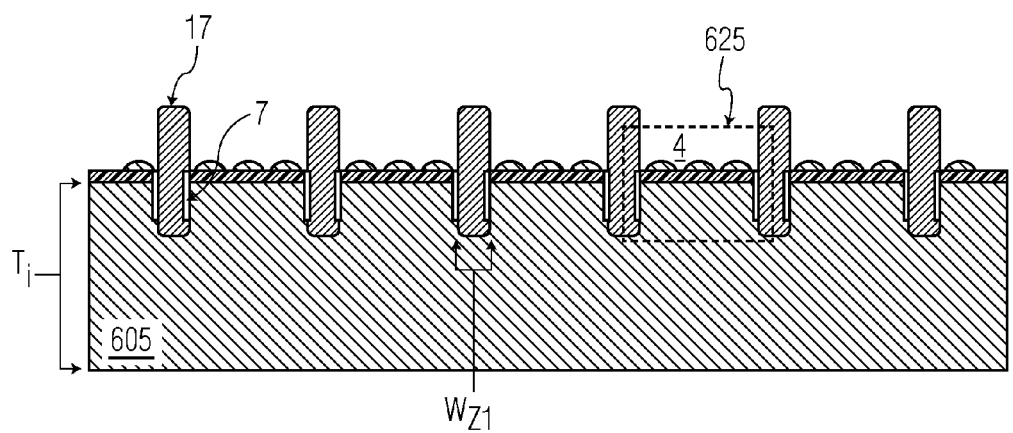
Figure 6D:
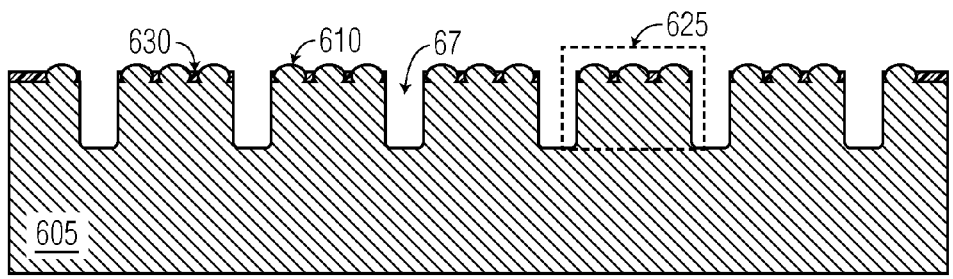
Figure 6E:
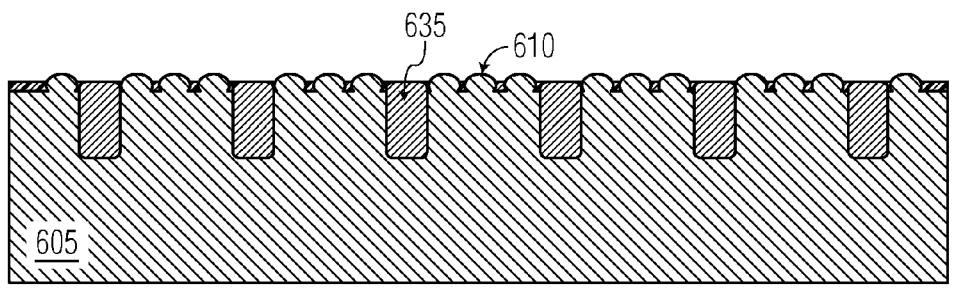
Figure 6F:
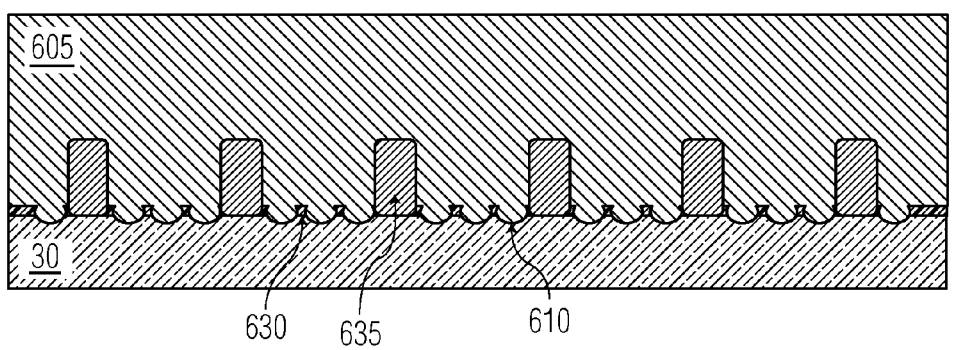
Figure 6G:
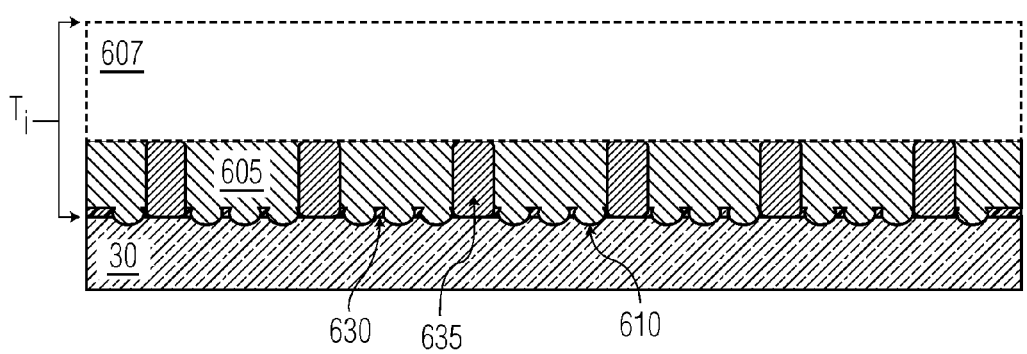
Figure 6H:
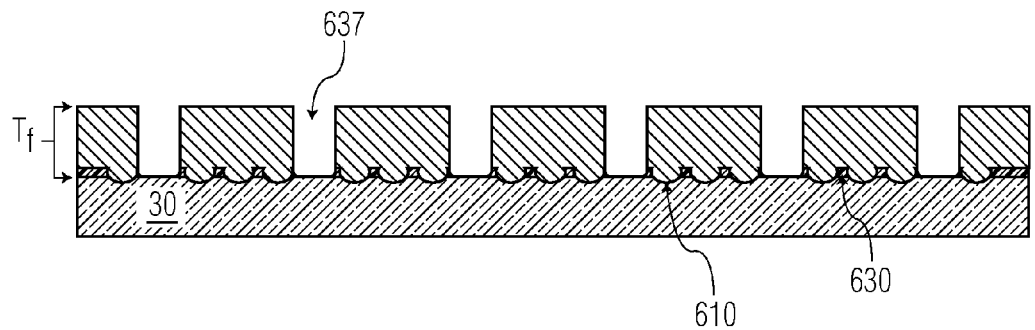
Figure 6I:
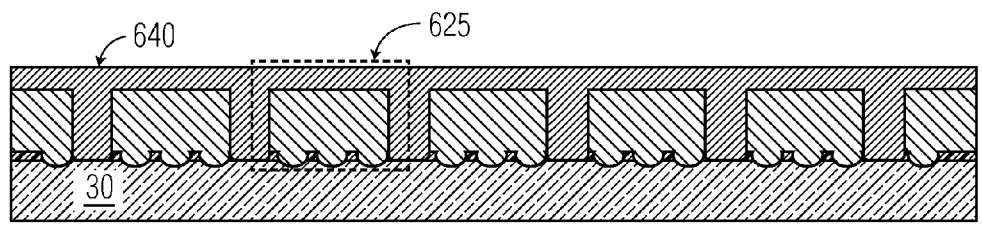
Figure 6J:
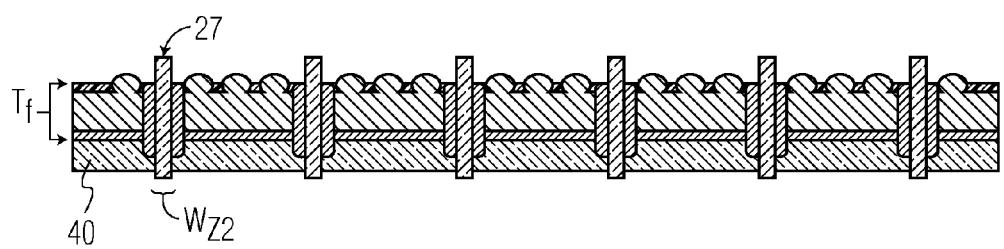

Refer to FIGS. 6A-6C. In a series of side views 600, a wafer substrate 605 with a number of active devices, has solder bumps 610 defined thereon. The topside surface of wafer substrate 605 (of a thickness $T_f$) is covered with a resilient material 620. Topside surfaces of the solder bumps 610 are left clean and exposed. In combination with laser grooving 7, with a saw blade 17 of a first kerf $W_{Z1}$, saw lanes between device die 625 are defined. The process may be a combination of one or more of a trench etch, laser grooving (LG) or a dicing-before-grinding (DbG).

Refer to FIGS. 6D-6G. After defining the trench 67, the depth of the trench 67 is about the same as the final thickness of the active device die 625. Within the trenches 67, in an optional process, a temporary filling 635 of a resilient material may be applied. The filling serves to maintain the relationship between devices fixed and less susceptible to mechanical movement during subsequent processing and handling. The wafer substrate 605 is mounted with the topside surface, onto a grinding tape 30. With a back grinding process, the wafer substrate is thinned by an amount shown by the dash lines 607.

Refer to FIGS. 6H-6K. After back grinding, additional polishing may implemented to release stress on the underside surface of the wafer substrate 605; a final thickness $T_f$ is achieved. The temporary filling 635 may be removed and another resilient material 640 may be used to fill the trenches 637 and also cover the back-side surface of the wafer substrate 605. In another example embodiment, the temporary filling 635 may be made of a permanent material, and subsequently only the underside surface of the wafer substrate 605 is covered with the other resilient material 640. The wafer substrate 605 is removed from the grinding tape 30 and mounted onto a sawing/dicing foil 40 on the covered resilient material 440. With a blade 27 of a second kerf ($W_{Z2}$), the wafer substrate 605 of active device die 625 are sawed apart into individual devices 650.

Figure 6K:
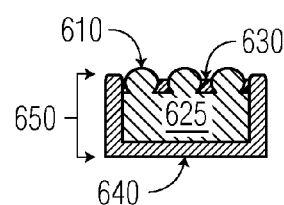

In an example process, the LG width is equal to original saw lane minus about 5 µm to about 20 µm, depending on the laser frequency used. The blade sizes used for Z1 are again about 5 µm to about 20 µm microns smaller than the LG width. In case a Z2 dicing step is needed, this blade will be again at least 5-10 micron thin. For a specific saw lane width of 80 µm with 60 µm PCM/OCM structures, the LG is 60-65 µm. The Z1 kerf is about 45 µm to about 50 µm. The Z2 kerf is about 30 µm to about 40 µm. These dimensions are not die size dependent. The number of balls per device die varies between a minimum of 2 for a discrete diode, to a maximum of 11×11 balls at this moment, but there is no process limitation. As technology evolves and makes it possible to have arrays greater than 11×11 balls, the techniques outlined in the present disclosure may be applied. One limitation is the board level reliability of a singulated WLCSP. The thickness of the molding compound will be between about 40 µm and about 160 µm, depending on the bump height. Refer to FIG. 6K. A device 650 has its vertical faces and underside surface covered with a resilient material 640. The solder bumps 610 are surrounded with resilient material 630. The device 625 is protected from damage when it is assembled into a sub-system board.

Molding, Grinding, Molding, and Dicing

Figure 7:
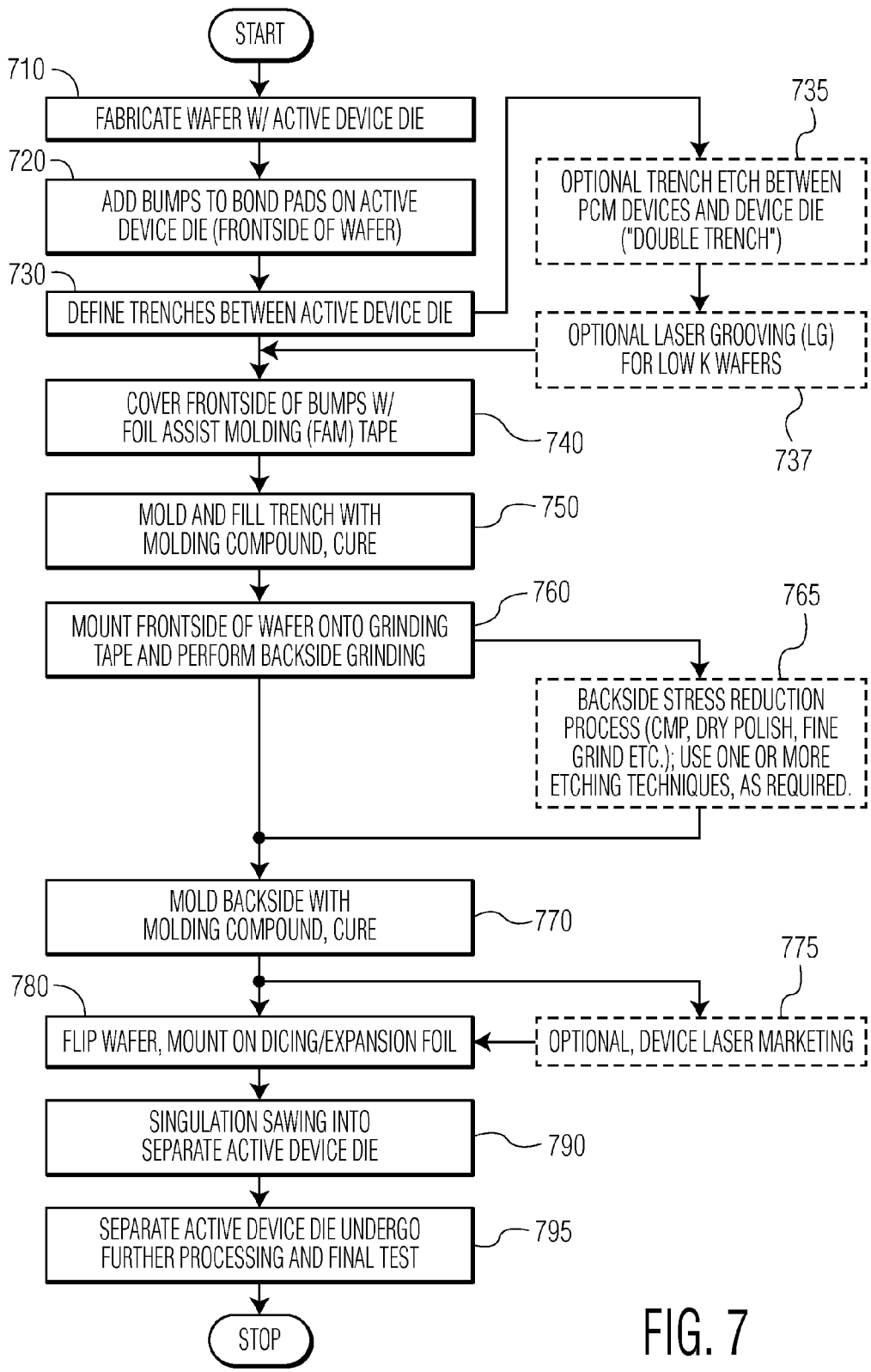
FIG. 7 is a flow diagram of an assembly process according to an embodiment of the present disclosure.
Figure 8A:
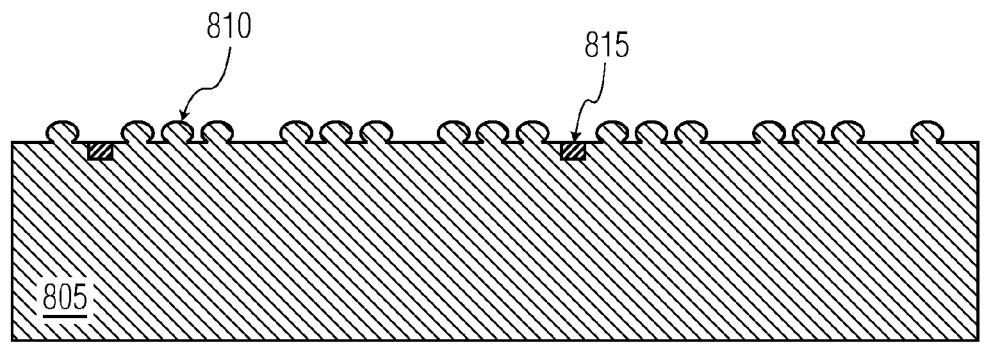
FIGS. 8A-8I is a series of side-views of the assembly process of FIG. 7.
Figure 8B:
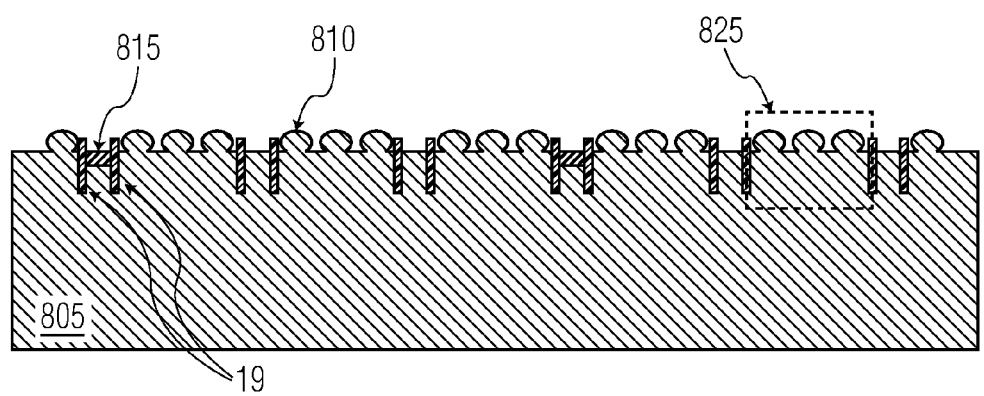
Figure 8C:
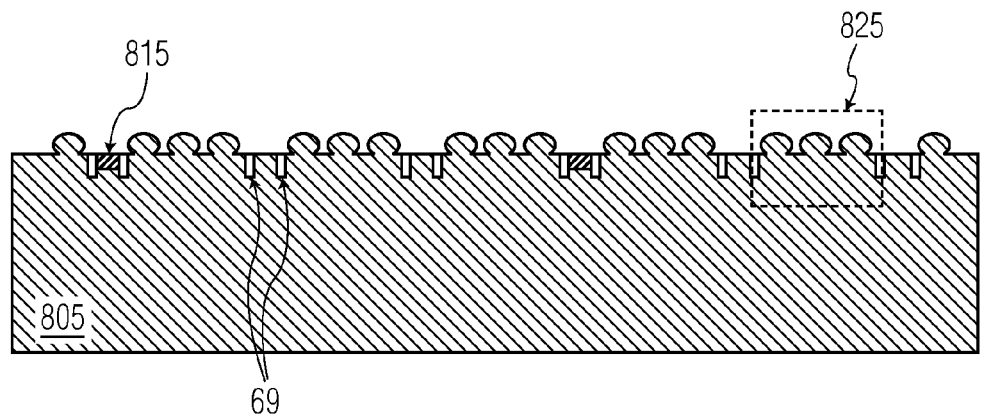
Figure 8D:
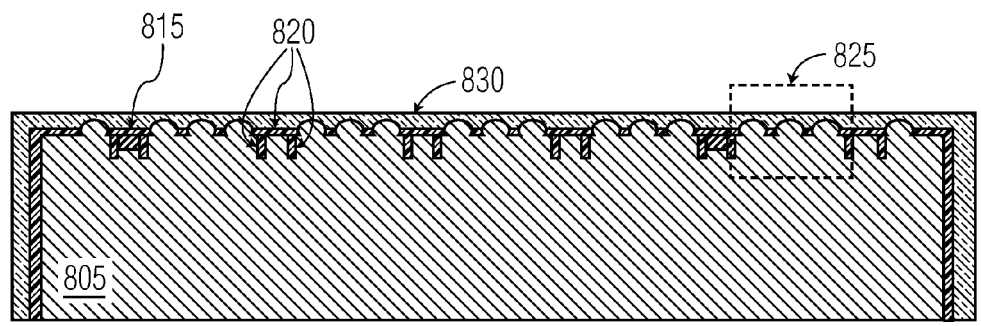
Figure 8E:
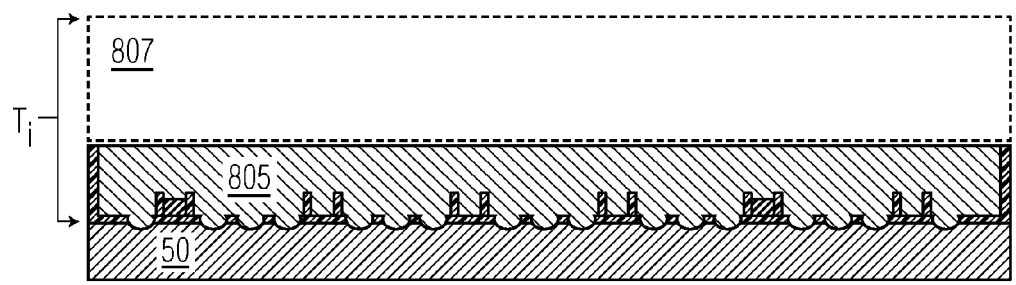
Figure 8F:
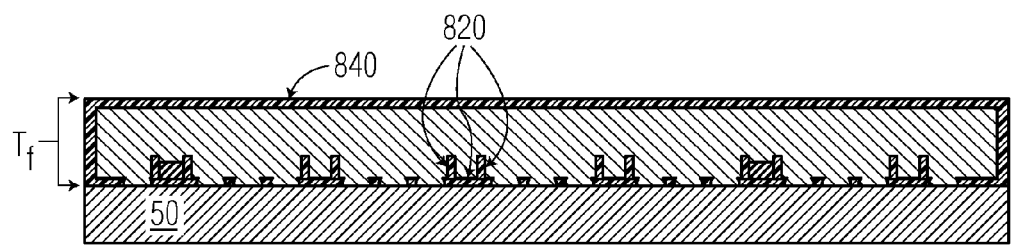
Figure 8G:
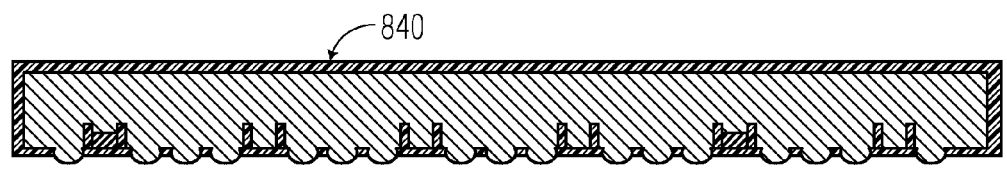
Figure 8H:
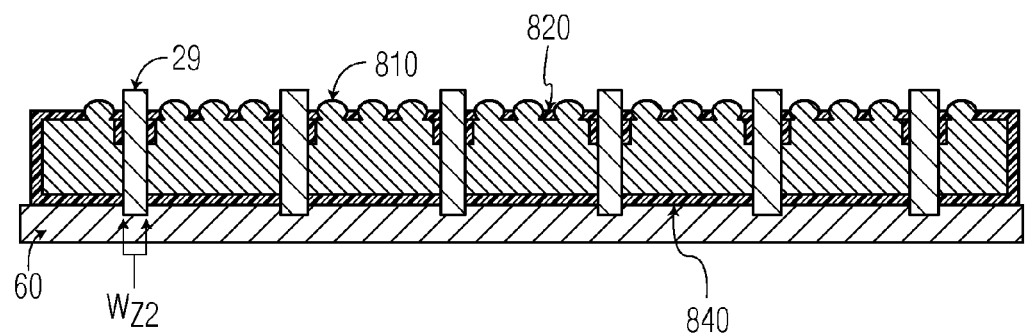

Refer to FIG. 7. In an example embodiment, a wafer substrate is fabricated with active device die in step 710. In step 720, solder bumps are applied to the active device die. In step 730, trenches are defined between active device die. In another example embodiment, the wafer substrate may have process control monitor (PCM) devices situated in the saw lanes between active devices. In an optional step 735, there may be a trench etch between PCM devices and active die (i.e., a "double trench"). In an optional step 737, an etch process, such as LG may be used to etch through metallization that may be present on PCM devices (LG may be necessary if wafer substrate is low-k). Thus, there is a double trench about the edges of the PCM device die between active devices (see FIGS. 8A-8B). After the trench etching, the topside of the solder bumps is covered with a foil assisted molding (FAM) tape, in step 740. In step 750, the trenches are filled with a molding compound. The topside of the wafer is mounted onto a grinding tape and the wafer undergoes back grinding in step 760. In another example embodiment, an optional backside stress-reduction process (step 765) which may use, alone or in combination, a chemical mechanical polishing (CMP), dry polishing, fine grinding, etc. In step 770, the underside surface of the wafer substrate is coated with a molding compound. An optional step 775 of laser marking device indicia, corresponding to the position of each active device, on the underside surface of the wafer substrate may be performed. The wafer substrate is flipped over and mounted onto a dicing/expansion foil, in step 780. A singulation sawing in step 790, separates the active device die into individual devices. The individual device die may under further processing and a final testing, at step 795, before shipping to the end user.

Refer to FIGS. 8A-8I. A series of side views depict the process described in FIG. 7. On a wafer substrate 805 having active devices 825, there are solder bumps 810 corresponding to the bond pads on each of the active devices. Further, there are PCM devices 815 between in saw lanes between some active devices. With a blade 19 of a narrow kerf, trenches may be cut between the PCM devices 815 and the active devices 825. As required, a LG process may be performed, as well. After the trench definition, trenches 69 separate PCM devices 815 and active devices 825. A FAM tape 830 is applied to the solder bumps 810 for protection as the wafer substrate 805 undergoes a topside molding 820. The trenches 69 are filled with molding compound 820 and spaces between solder bumps 810 are filled in, as well. The FAM 830 is removed and the wafer substrate 805, with its topside surface, is placed onto a grinding tape 50. A back grinding process removes material 805' to the final device thickness $T_f$. After back grinding, a molding compound 840 may be applied to the underside surface of the wafer substrate 805. The wafer substrate 805 is remounted on the underside surface, now covered with molding compound 840, onto a sawing/dicing tape 60. With a blade 29 of second wider kerf, $W_{Z2}$, the active devices 825 are singulated into individual devices 850. Note that the kerf of the blade is about the width of the PCM devices 815.

Figure 8I:
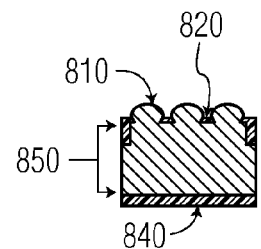

Refer to FIG. 8I. A completed device 850 has resilient material covering the surface opposite the side having the solder balls 810 of the active device 825. The solder balls 810 are surround with resilient material 820.

Mold Before Reflow and Grinding

In another disclosed process, the bumps used on the bond pads of the active device may be bumps of plated solder or stud bumps of copper (Cu), gold (Au), or silver (Ag), for example. These bumps have a nearly vertical profile and flat horizontal (planar) surface. The flat surface facilitates wafer testing, even after die singulation. A cylindrical encapsulation collar around the solder or stud is possible. Unlike ball drop bumps, there are fewer geometric irregularities, such as wedging owing to ball shape. Thus, board level reliability is enhanced.

Figure 9A:
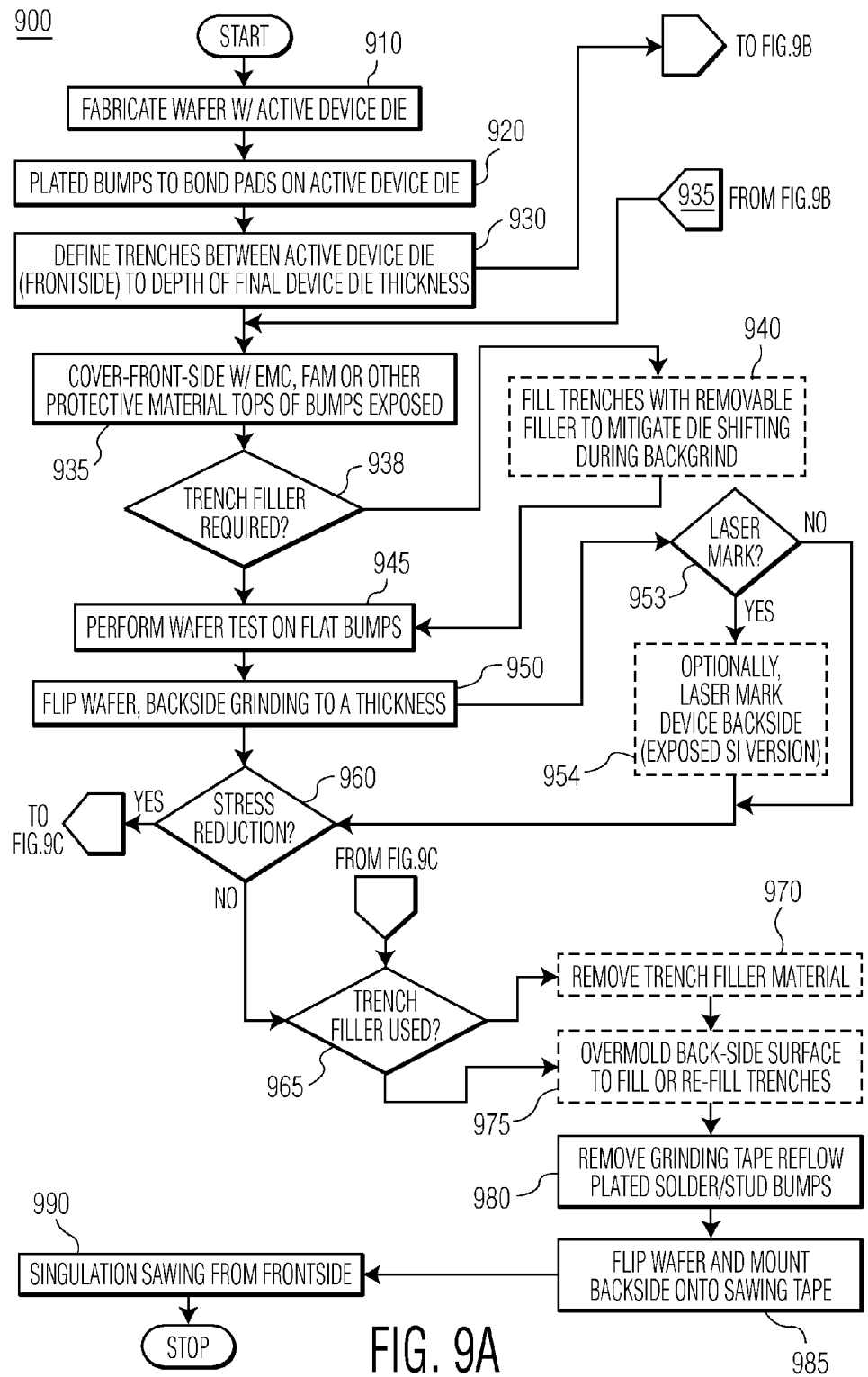
FIGS. 9A-9C are flow diagrams of an assembly process according to an embodiment of the present disclosure.
Figure 9B:
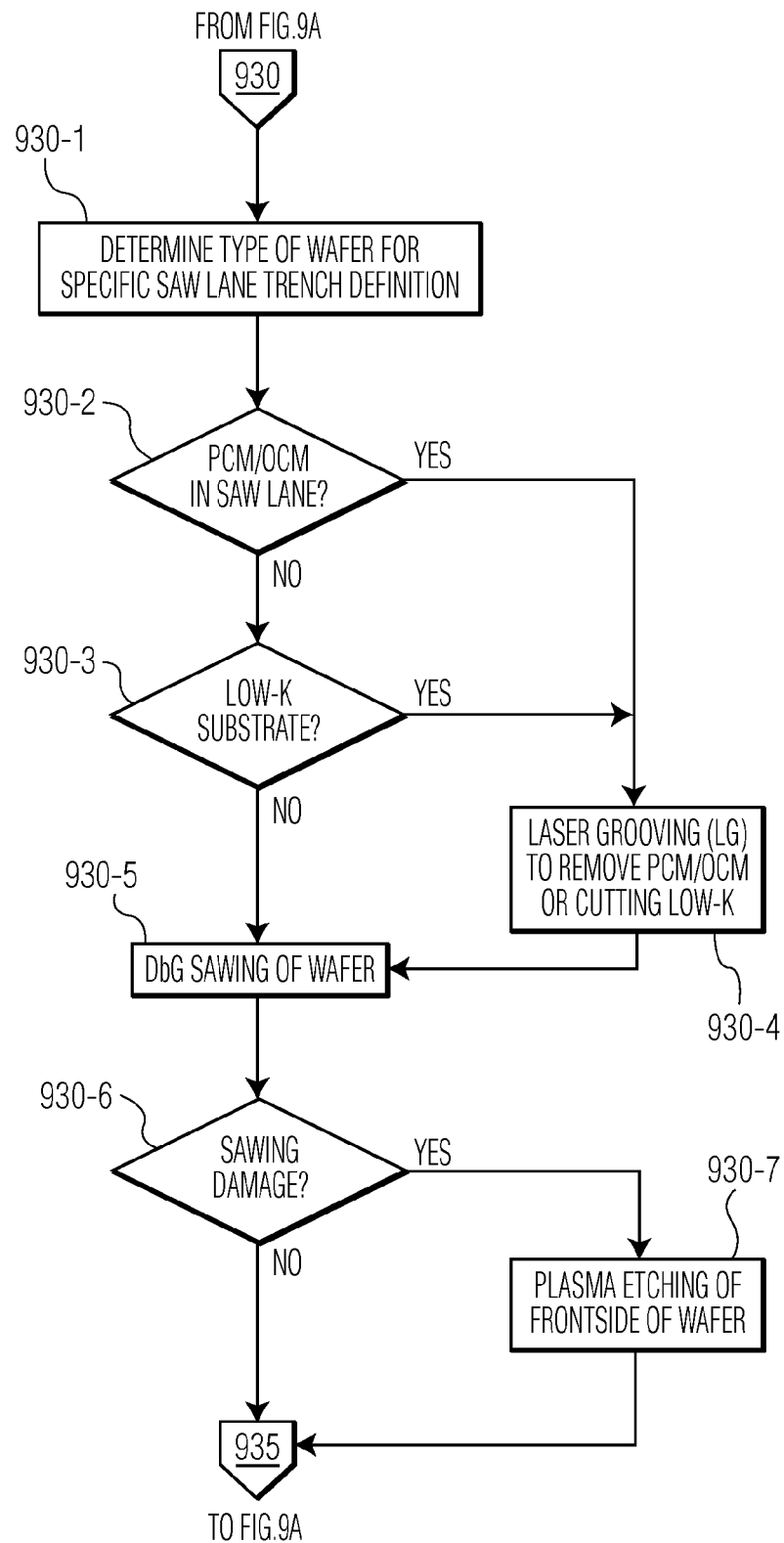
Figure 9C:
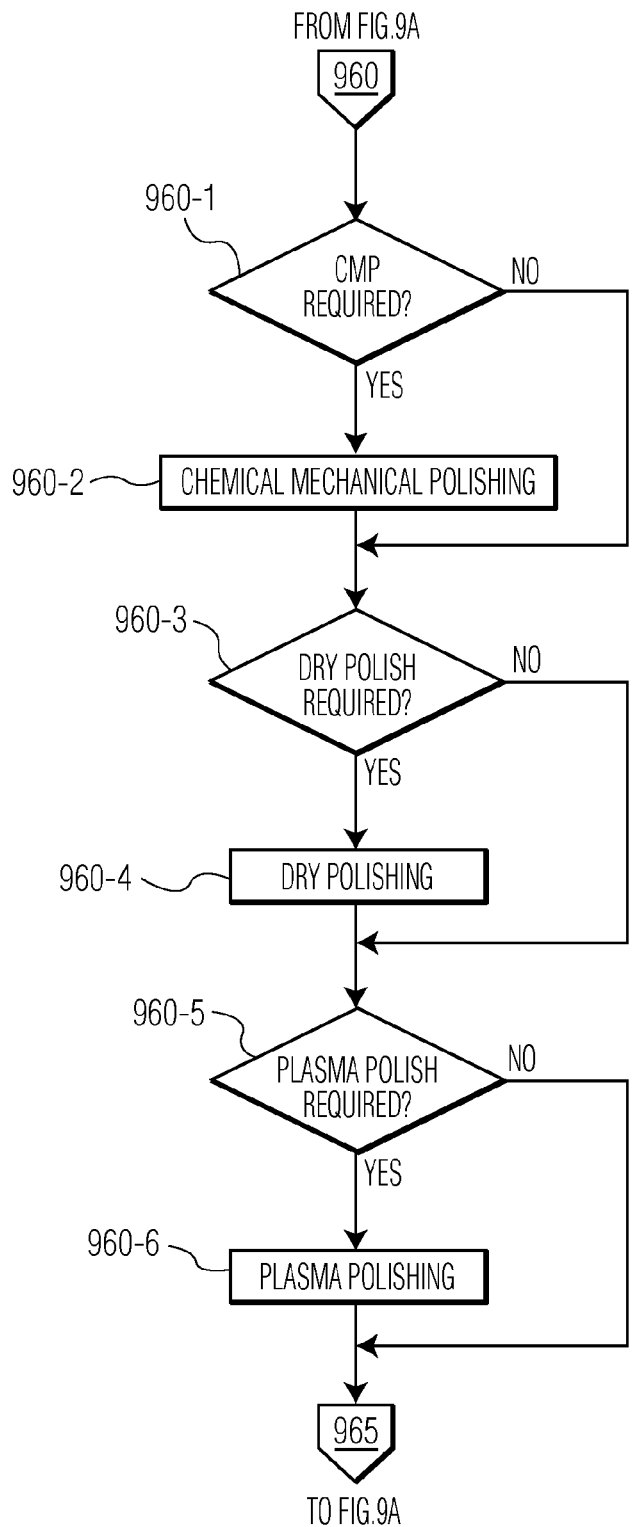

Refer to FIGS. 9A-9C. An example process 900 discloses fabrication of a WLCSP device according to the present disclosure. In step 910 a wafer, having active device die on the front-side surface, is fabricated. In step 920, on the bond pad areas of the active device, after an appropriate UBM layer has been prepared, plated bumps or stud bumps are applied thereon. In step 930, trenches between the active device die (in areas corresponding to saw lanes about the device die) are defined from the front-side surface. The depth of the trench is substantially the depth of the final device die thickness.

Refer to FIG. 9B. The defining of the trenches of step 930 may be subject to a one or several etch processes. Refer to FIG. 9B. In step 930-1, how the wafer substrate has been processed determines the properties of the saw lanes in which trenches are defined. In step 930-2, whether PCM/OCM structures are present in the saw lanes, in step 930-3 whether a low-k substrate has been used, determines whether laser grooving (LG), of step 930-4, is used to remove the PCM/OCM or to cut through the low-k layer of wafer. After the LG, in step 930-5, the wafer undergoes a DbG sawing. If sawing damage is noted, in step 930-6, plasma etching of the exposed front-side surfaces of the cuts is performed in step 930-7.

In step 935, the front-side surface of the wafer substrate is covered with a foil-assisted-molding (FAM) tape or an EMC. The flat surfaces of the bumps remain exposed so that in step 945, an electrical test may be performed on the device die via the bumps. In an optional process, steps 935-940, the defined trenches may be filled in with a removable material that prevents the die from shifting during back-grinding. Prior to filling in the removable material, a FAM or other protective material is applied to protect the solder surfaces of the bumps In step 950, the wafer is flipped over and mounted onto a grinding tape; the wafer undergoes a back-grinding process to thin it out to the final device thickness. As required by the end-user, an optional laser marking of device indicia may be performed at steps 953, 954. In some situations, there may be back-grinding induced stress on the wafer substrate, at an optional step 960 (See FIG. 9C). The stress-reduction may include one or more processes of chemical-mechanical polishing (Step 960-1), dry polishing (Step 960-2), or plasma polishing (Step 960-3).

In step 965, if trench filler has been used, it is removed in step 970. An over-molding process of step 975 re-fills the trenches with an epoxy molding compound or other appropriate material. In step 980, the grinding tape is removed; a reflow process forms the plated solder bumps or pillar having a top coat of tin (Sn) solder. In Step 985, the wafer substrate is flipped and mounted, on its back-side surface, to sawing tape. A singulation sawing from the front-side surface, step 990, separates the device die into separated individual WLCSP devices whose vertical faces, back-side, and front-side surfaces are protected by a resilient encapsulating material.

Figure 10A:
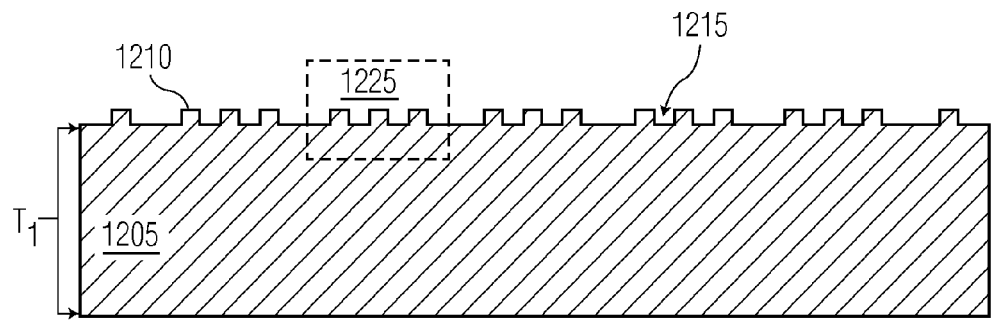
FIGS. 10A-10J is a series of side-views of the assembly process of FIGS. 9A-9C.
Figure 10B:
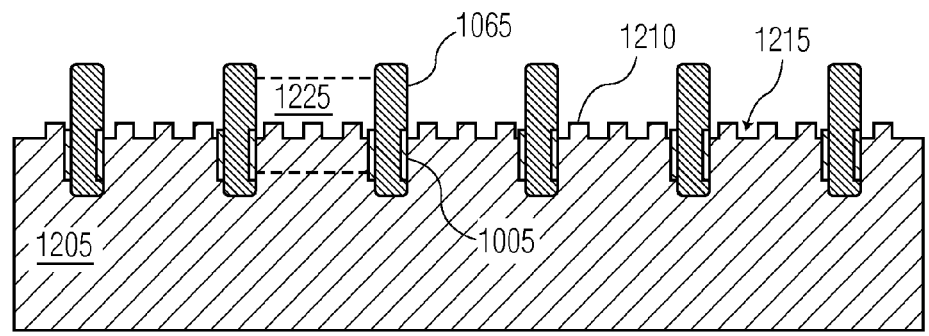
Figure 10C:
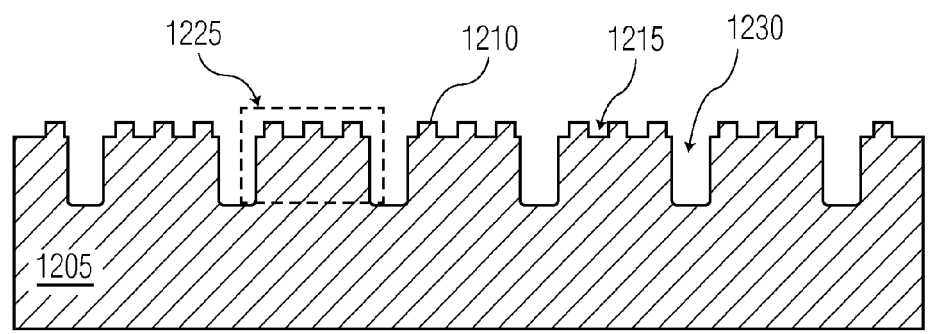
Figure 10D:
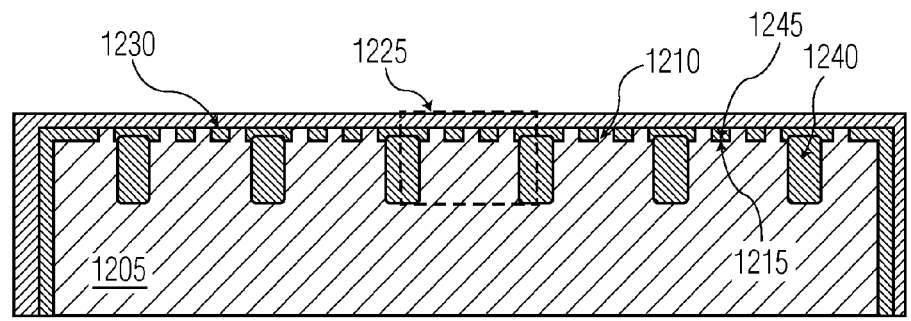
Figure 10E:
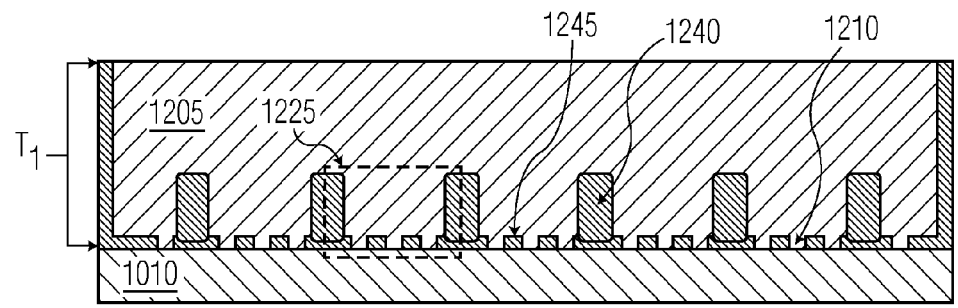
Figure 10F:
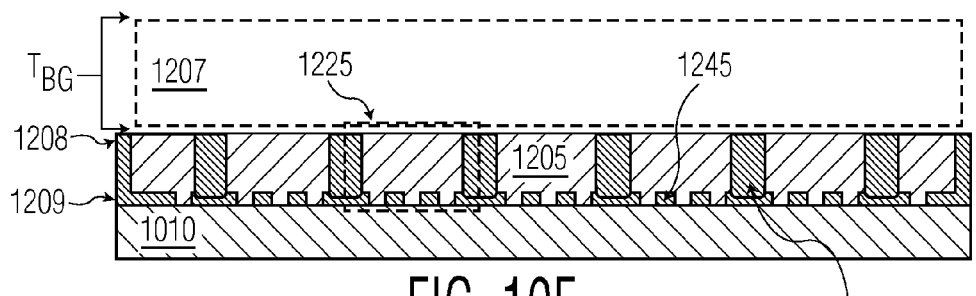
Figure 10G:
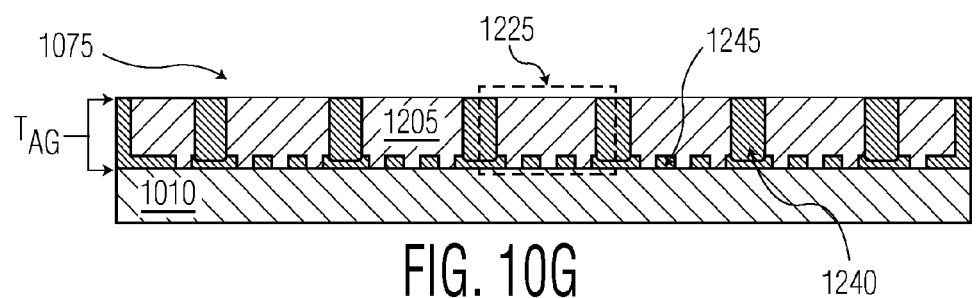
Figure 10H:
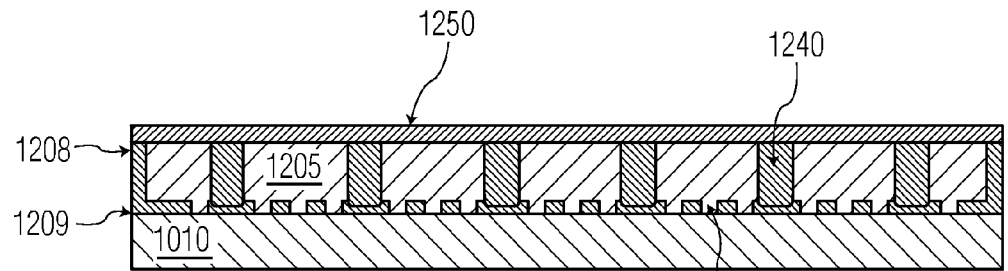
Figure 10I:
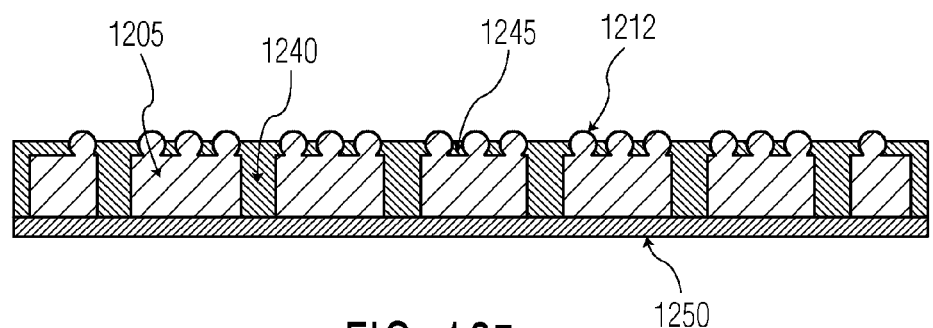
Figure 10J:
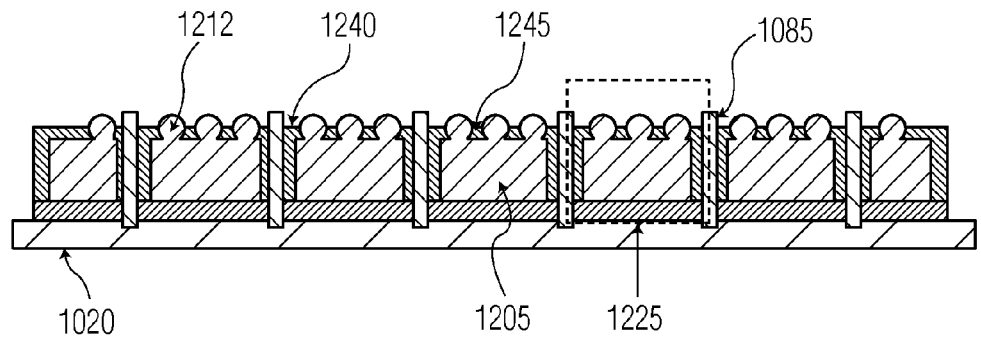

Refer to FIGS. 10A-10J. In a series of side-views, according to an embodiment of the present disclosure, a wafer substrate whose active devices utilized plated solder or stud bumps is prepared. Refer to FIGS. 10A-10C. On wafer substrate 1205 with a plurality of active devices 1225, each active device 1225 has plated solder or stud bumps 1210 defined on the active device bond pads, the bumps 1210 have spacing 1215 between them (i.e., corresponding to the spacing between active device bond pads). With a trenching process, as described in connection with FIGS. 9A-9B, a saw blade 1065 in combination with other processes defines a trench 1230 between each active device 1225. Refer to FIG. 10D. A FAM tape 1235 is applied to the front-side surface of the wafer substrate 1205. The FAM tape 1235 protects to top-side, exposed surfaces of the stud bumps 1210. A resilient material 1240 fills in the trenches 1230 and spaces 1215 in between the stud bumps 1210. After the resilient material filling, the FAM tape 1235 is removed. Refer to FIGS. 10E-10G. There are filled in trenches 1240 and filled in spaces 1245. The filler material 1240, 1245 protects the vertical faces of the stud bumps 1210 and prevents device die 1225 from shifting about during subsequent processing. The wafer substrate has an initial thickness $T_I$. Refer to FIG. 10F. The wafer substrate 1205, placed onto a grinding film 1010, undergoes a back-grinding that removes an amount (thickness $T_{BG}$) 1207 of material so that the filler 1240 at the bottom of the trenches 1230 is exposed. Refer to FIG. 10G. In an example embodiment, having exposed the underside surfaces 1208 of the active devices 1225, a laser marking 1075 may be performed, for those devices whose back-side surface 1208 remains exposed at completion of assembly. In another example embodiment, a resilient material 1250, such as an epoxy molding compound, may be applied to the back-side surface 1208. The grinding tape 1010 is removed. The wafer substrate 1205 with devices 1225 on resilient material 1250 and surrounded by a resilient material 1240, 1245 is subjected to a reflow process. The solder studs 1210 transform into balls 1212; any resilient material 1245 covering the balls falls off. While on a sawing foil 1020, with a saw blade 1085, the devices 1225 are separated into individual WLCSP devices whose vertical faces, back-surface, and solder bumps are enveloped in a protective material to minimize damage during subsequent assembly.

Numerous other embodiments of the invention will be apparent to persons skilled in the art without departing from the spirit and scope of the invention as defined in the appended claims.

The invention claimed is:

1. A method for assembling a wafer level chip scale processed (WLCSP) wafer, the wafer substrate having a front-side surface and an opposite back-side surface, the front-side surface having a layer of low-k material at a thickness, a plurality of device die on the front-side surface, the plurality of device die having bond pads upon which ball-drop solder balls are defined, the plurality of device die spaced apart one another by saw lane regions, the method comprising:
    filling saw lane regions and covering the front-side surface with a front-side molding compound, the molding compound surrounding the solder balls on each one of the plurality of device die, the front-side molding compound has a first thickness;
    back-grinding the back-side surface of the wafer substrate to about a depth of a finished device;
    laser grooving (LG) trenches in the saw lanes, the laser grooving done from the back-side surface of the wafer substrate to a depth of the thickness of the low-k material;
    making first cuts with a saw blade of a first kerf, sawing through the back-side surface of the wafer substrate in the saw lanes, to the depth of the finished device;
    applying a back-side molding compound to the back-side surface of the wafer substrate, wherein the molding compound fills in the LG trenches and first cuts and covers the back-side surface of the wafer substrate, the back-side molding compound has a second thickness; and
    making second cuts with a saw blade of a second kerf, the second cuts are at a depth a combination of the thickness of the finished device, the first thickness of the front-side molding compound, and the second thickness of the back-side molding compound, thereby separating the plurality of device die into individual devices, the individual devices having molding compound on vertical faces and on front-side and back-side surfaces.

2. A method for assembling a wafer level chip scale processed (WLCSP) wafer, the wafer having a front-side surface and an opposite back-side surface, a plurality of device die on the front-side surface, the plurality of device die having bond pads upon which bumps are defined, the plurality of device die spaced apart one another by saw lanes, the method comprising:
    covering the front-side surface with a molding compound, the molding compound surrounding the bumps on each one of the plurality of device die;
    defining trenches in the saw lanes, on the front-side surface, between each one of the plurality of device die, the trenches having a depth of a final device die thickness;
    mounting the wafer onto a grinding tape;
    back grinding the back-side surface of the wafer to the depth of the final device die thickness;
    over-molding the back-side surface and filling in the trenches in the saw lanes with a molding compound; and
    sawing apart the wafer in the trenches filled with molding compound, so as to separate the plurality of device die into individual devices.

3. The method as recited in claim 2, wherein defining the trenches in the saw lanes includes, at least one of the following:
    sawing the topside surface of the wafer with dicing-before-grinding (DbG) process;
    laser grooving;
    plasma etching; and
    again sawing to below the final device die thickness.

4. The method as recited in claim 2, further comprising,
    before back-grinding the back-side surface of the wafer, filling in the trenches with a temporary filler material; and
    after back-grinding the back-side surface of the wafer, removing the temporary filling material from the trenches.

5. The method as recited in claim 4, wherein back grinding further includes a stress-reducing process including at least one of the following: chemical-mechanical polishing (CMP), dry polishing, plasma polishing.

6. A method for assembling a wafer level chip scale processed (WLCSP) wafer, the wafer having a front-side surface and an opposite back-side surface, a plurality of device die on the front-side surface, the plurality of device die having bond pads upon which bumps are defined, the plurality of device die spaced apart one another by saw lanes of a width, the method comprising:
    defining a plurality of trench pairs in saw lanes, with a first saw blade of a kerf, on topside surface, between each one of the plurality of device die, the trench pair having a depth of about half a device die thickness;
    applying a foil assist molding (FAM) tape covering exposed surfaces of the bumps on each one of the plurality of device die;
    over-molding the topside surface and filling in the trench pairs with a molding compound;
    removing the FAM tape from the wafer;
    back grinding underside surface of the wafer to a depth of a final device die thickness;
    applying molding compound onto the underside surface; and sawing apart the wafer, with a saw blade of a second kerf, about centers of the trench pairs filled with molding compound and through the underside surface covered with molding compound, so as to separate the plurality of device die into individual devices.

7. The method as recited in claim 6, wherein a width of the trench pair is about the width of a saw lane.

8. The method as recited in claim 7, wherein the width each trench in the trench pair is about one-fourth of the width of the saw lane, wherein the portion between each trench is about one half of the width of the saw lane.

9. The method as recited in claim 8, wherein the width of each trench in the trench pair is about equal to the kerf of the first saw blade, and the portion between each trench is about equal to the kerf of a second saw blade.

10. A method for assembling a wafer level chip scale processed (WLCSP) wafer, the wafer substrate having a front-side surface and an opposite back-side surface, a plurality of device die on the front-side surface, the plurality of device die having bond pads upon which conductive studs, are defined, wherein the conductive studs are solder plated, the method comprising:

defining trenches in saw lanes, on the front-side surface, between each one of the plurality of device die, the trenches having a depth of a final device die thickness;

covering the front-side of the wafer substrate with a protective material so that topside surfaces of the conductive studs are protected;

filling the trenches and covering the front-side surface with a temporary filler, the temporary filler surrounding the conductive studs on each one of the plurality of device die;

back grinding the back-side surface of the wafer substrate to the depth of the final device die thickness;

removing the temporary filler from the trenches;

over-molding the trenches from the back-side surface;

reflowing solder plating on the conductive studs;

sawing apart the wafer in the trenches filled with molding compound, so as to separate the plurality of device die into individual devices.

11. The method as recited in claim 10, wherein the conductive studs are pillar structures selected from one of the following: copper, gold, silver.

12. The method as recited in claim 10 wherein in the conductive stud is solder plating.

* * * * *